United States Patent
Yoon et al.

(10) Patent No.: US 10,686,101 B2
(45) Date of Patent: Jun. 16, 2020

(54) SEMICONDUCTOR LIGHT EMITTING DEVICE

(71) Applicant: SAMSUNG ELECTRONICS CO., LTD., Suwon-si (KR)

(72) Inventors: Ju Heon Yoon, Seoul (KR); Ha Yeong Son, Suwon-si (KR); Young Sub Shin, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/028,969

(22) Filed: Jul. 6, 2018

(65) Prior Publication Data
US 2019/0273187 A1    Sep. 5, 2019

(30) Foreign Application Priority Data

Mar. 2, 2018  (KR) ........................ 10-2018-0025091

(51) Int. Cl.

| | |
|---|---|
| *H01L 33/42* | (2010.01) |
| *H01L 33/46* | (2010.01) |
| *H01L 33/44* | (2010.01) |
| *H01L 33/62* | (2010.01) |
| *H01L 33/40* | (2010.01) |
| *H01L 33/06* | (2010.01) |
| *H01L 33/32* | (2010.01) |
| *H01L 33/00* | (2010.01) |

(52) U.S. Cl.
CPC ............ *H01L 33/46* (2013.01); *H01L 33/405* (2013.01); *H01L 33/42* (2013.01); *H01L 33/44* (2013.01); *H01L 33/62* (2013.01); *H01L 33/0075* (2013.01); *H01L 33/06* (2013.01); *H01L 33/32* (2013.01); *H01L 2933/0016* (2013.01); *H01L 2933/0025* (2013.01); *H01L 2933/0066* (2013.01)

(58) Field of Classification Search
CPC ....... H01L 33/405; H01L 33/42; H01L 33/44; H01L 33/46; H01L 33/52; H01L 33/54; H01L 33/60; H01L 33/62
See application file for complete search history.

(56) References Cited

U.S. PATENT DOCUMENTS

| | | |
|---|---|---|
| 6,645,830 B2 | 11/2003 | Shimoda et al. |
| RE38,466 E | 3/2004 | Inoue et al. |

(Continued)

FOREIGN PATENT DOCUMENTS

| | | |
|---|---|---|
| JP | 2017513234 A | 5/2017 |
| KR | 1020170039490 A | 4/2017 |

(Continued)

*Primary Examiner* — Cuong Q Nguyen
(74) *Attorney, Agent, or Firm* — Sughrue Mion, PLLC

(57) ABSTRACT

Provided is a semiconductor light emitting device which includes: a light emitting structure including a plurality of semiconductor layers and configured to generate and emit light to an outside of the light emitting structure; a transparent electrode layer disposed on the light emitting structure; a transparent protective layer disposed on the transparent electrode layer; a distributed Bragg reflector (DBR) layer disposed on the transparent protective layer and covering at least a part of the transparent electrode layer; and at least one electrode pad connected to the transparent electrode layer through a hole or via.

21 Claims, 21 Drawing Sheets

(56) References Cited

U.S. PATENT DOCUMENTS

| | | |
|---|---|---|
| 6,732,608 B2 | 5/2004 | Suzuki |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,372,078 B2 | 5/2008 | Jang et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 2014/0353713 A1* | 12/2014 | Kuh ................ H01L 31/022408 257/184 |
| 2015/0357525 A1 | 12/2015 | Sasaki |
| 2017/0365745 A1 | 12/2017 | Yang et al. |
| 2018/0026154 A1 | 1/2018 | Kitano et al. |
| 2018/0190871 A1* | 7/2018 | Kim ..................... H01L 33/405 |

FOREIGN PATENT DOCUMENTS

| | | |
|---|---|---|
| KR | 101762259 B1 | 8/2017 |
| KR | 1020170091300 A | 8/2017 |
| KR | 1020170093574 A | 8/2017 |

* cited by examiner

SEMICONDUCTOR LIGHT EMITTING DEVICE

CROSS-REFERENCE TO THE RELATED APPLICATION

This application claims priority from Korean Patent Application No. 10-2018-0025091 filed on Mar. 2, 2018 in the Korean Intellectual Property Office, the disclosure of which is incorporated herein by reference in its entirety.

BACKGROUND

1. Field

Apparatuses and methods consistent with exemplary embodiments of the inventive concept relate to a semiconductor light emitting device.

2. Description of Related Art

Semiconductor light emitting devices are known as next generation light sources having advantages such as a long lifespan, low power consumption, a quick response time, environmental friendliness, and the like, as compared with conventional light sources, and as such, semiconductor light emitting devices have come to prominence as important light sources in various products such as backlights of display devices, and the like.

SUMMARY

Example embodiments provide a semiconductor light emitting device having improved luminous flux and improved reliability. Example embodiment also provide a method of manufacturing this semiconductor light emitting device.

According to example embodiments, there is provided a semiconductor light emitting device which may include: a light emitting structure including a plurality of semiconductor layers and configured to generate and emit light to an outside of the light emitting structure; a transparent electrode layer disposed on the light emitting structure; a transparent protective layer disposed on the transparent electrode layer; a distributed Bragg reflector (DBR) layer disposed on the transparent protective layer and covering at least a part of the transparent electrode layer; and at least one electrode pad connected to the transparent electrode layer through a hole or via.

According to example embodiments, there is provided a semiconductor light emitting device which may include: a light emitting structure including a plurality of semiconductor layers and configured to generate and emit light to an outside of the light emitting structure; a transparent electrode layer disposed on the light emitting structure; a transparent protective layer disposed on the transparent electrode layer; an insulating layer disposed on the transparent protective layer and covering at least a part of the transparent electrode layer; and at least one electrode pad connected to the transparent electrode layer through a hole or via, wherein a refractive index of the transparent protective layer is lower than a refractive index of the insulating layer, wherein the hole or via comprises a first inner wall and a second inner wall connected to each other and having different inclination angles with respect to an upper surface of the transparent electrode layer, and wherein the first inner wall is surrounded by the insulting layer, and the second inner wall is surrounded by the transparent protective layer.

According to example embodiments, there is provided a method of manufacturing a semiconductor light emitting device, which may include: forming a light emitting structure on a substrate comprising a plurality of semiconductor layers; sequentially forming a transparent electrode layer, a transparent protective layer, and an insulating layer on the light emitting structure; forming a hole or via penetrating through the insulating layer and the transparent protective layer to expose portions of the transparent electrode layer; and forming an electrode pad on the insulating layer so that the electrode pad is connected to the transparent electrode layer through the hole or via. Here, the forming the hole or via includes: a first step of removing a portion of the insulating layer such that a surface of the transparent protective layer is exposed in the hole or via; and a second step of removing a portion of the transparent protective layer so that the transparent electrode layer is exposed in the hole or via.

BRIEF DESCRIPTION OF DRAWINGS

The above and other aspects, features, and advantages of the inventive concept will be more clearly understood from the following detailed description, taken in conjunction with the accompanying drawings, in which.

DETAILED DESCRIPTION

Figure 1:
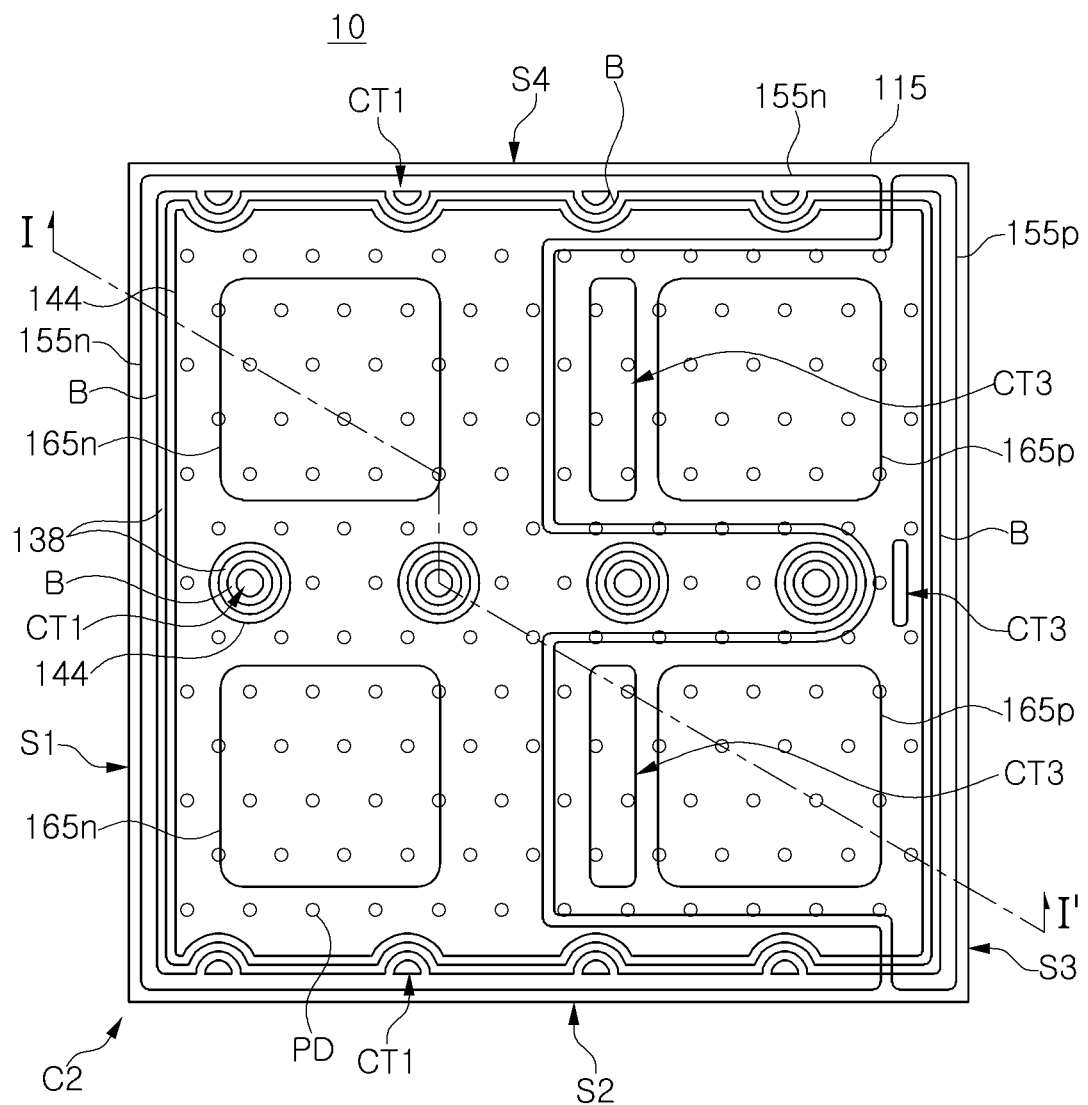
FIG. 1 is a plan view schematically illustrating a semiconductor light emitting device according to an example embodiment.

Various example embodiments of the inventive concepts will be described more fully hereinafter with reference to the accompanying drawings. The inventive concepts may, however, be embodied in many different forms and should not be construed as limited to the embodiments set forth herein. Rather, these embodiments are provided so that this description will be thorough and complete, and will fully convey the scope of the inventive concepts to those skilled in the art.

In the drawings, the sizes and relative sizes of layers and regions may be exaggerated for clarity.

It will be understood that when an element or layer is referred to as being "over," "above," "on," "connected to" or "coupled to" another element or layer, it can be directly over, above, on, connected or coupled to the other element or layer or intervening elements or layers may be present. In contrast, when an element is referred to as being "directly over," "directly above," "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer (e.g., a first conductive type semiconductor layer) or section discussed below could be termed a second element, component, region, layer (e.g., a second conductive type semiconductor layer) or section, and vice versa, without departing from the inventive concept.

Hereinafter, example embodiments will be described with reference to the accompanying drawings.

Figure 2:
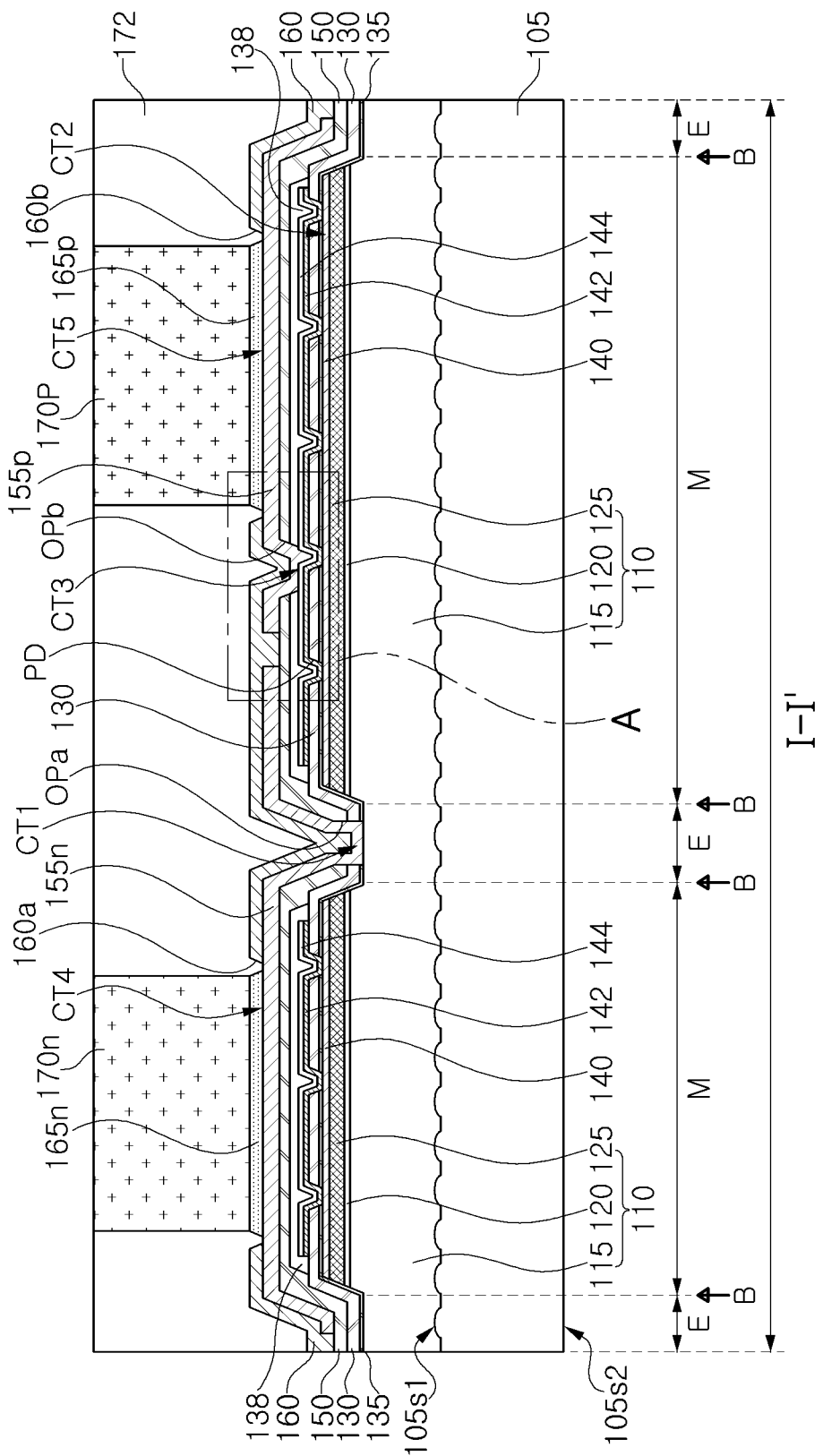
FIG. 2 is a cross-sectional view taken along the line I-I' of FIG. 1.

FIG. 1 is a plan view schematically illustrating a semiconductor light emitting device according to an example embodiment, and FIG. 2 is a cross-sectional view taken along the line I-I' of FIG. 1.

First, an example of a semiconductor light emitting device 10 according to an example embodiment will be described with reference to FIGS. 1 and 2.

Referring to FIGS. 1 and 2, a semiconductor light emitting device 10 according to an example embodiment may include a substrate 105, a light emitting structure 110, a transparent electrode layer 140, a first transparent protective film 135 (also referred to as a 'transparent protective layer'), a first insulating layer 130 (also referred to as an 'insulating layer'), and a reflective electrode layer 144.

The semiconductor light emitting device 10 may further include a second insulating layer 150, a first connecting electrode 155$n$, a second connecting electrode 155$p$, a first electrode pad 165$n$, a second electrode pad 165$p$, a first solder column 170$n$, and a second solder column 170$p$.

The substrate 105 may have a front surface 105$s$1 and a rear surface 105$s$2 opposing the front surface 105$s$1. The substrate 105 may be a substrate for growing a semiconductor, and may be formed of an insulating, conductive, or semiconductive material such as sapphire, Si, SiC, MgAl$_2$O$_4$, MgO, LiAlO$_2$, LiGaO$_2$, or GaN. Sapphire may be a crystal having electrically insulating properties and having Hexa-Rhombo R3c symmetry, and may be used as a substrate for growing a nitride semiconductor.

Throughout the specification, terms such as "front side" and "rear side" are used for distinguishing between relative positions of components and the technical idea is not limited by these terms. Terms such as "front surface", "rear surface", and the like, may be replaced with other terms such as "first surface", "second surface", and the like, or terms such as "upper surface", "lower surface", and the like, and used to explain components of the present disclosure. Accordingly, the front surface 105$s$1 and the rear surface 105$s$2 of the substrate 105 may be replaced by an upper surface 105$s$1 and a lower surface 105$s$2 of the substrate 105 or by a first surface 105$s$1 and a second surface 150$s$2 of the substrate 105, respectively.

The light emitting structure 110 may be arranged on the front surface 105$s$1 of the substrate 105.

In an example, the front surface 105$s$1 of the substrate 105 may be formed to have an irregular structure (or a concavo-convex structure), and the irregular structure may improve crystallinity and light emission efficiency of semiconductor layers constituting the light emitting structure 110. In the present embodiment, the irregular structure of the front surface 105$s$1 of the substrate 105 is illustrated as having a dome-shaped convex shape, but the inventive concept is not limited thereto. For example, the irregular structure of the front surface 105$s$1 of the substrate 105 may have various other shapes such as a square or triangular shape. In addition, the irregular structure of the front surface 105$s$1 of the substrate 105 may be selectively formed and may be omitted.

In an example, the substrate 105 may be removed later according to example embodiments. For example, the substrate 105 may be provided as a growth substrate for growing the light emitting structure 110, and thereafter, it may be removed through a separation process. Here, the substrate 105 may be separated from the light emitting structure 110 by a laser lift-off (LLO) method, a chemical lift-off (CLO) method, or the like.

Although not shown, a buffer layer may further be provided on the front surface 105$s$1 of the substrate 105. The buffer layer, serving to alleviate lattice defect of the semiconductor layer grown on the substrate 105, may be formed of an undoped semiconductor layer formed of a nitride, or the like. Undoped GaN, AlN, InGaN or the like, may be applied to the buffer layer, and here, the buffer layer may be formed by growing undoped GaN, AlN, or InGaN to a thickness of tens to hundreds of angstroms (Å) at low temperatures of 500° C. to 600° C. Here, undoping refers to that the semiconductor layer is not intentionally subjected to an impurity doping process. However, such a buffer layer is not essential and may be omitted according to example embodiments.

The light emitting structure 110 may include a first conductivity type semiconductor layer 115, an active layer 120, and a second conductivity type semiconductor layer 125.

The first conductivity type semiconductor layer 115 may be grown from the front surface 105$s$1 of the substrate 105. The first conductivity type semiconductor layer 115 may be formed of a semiconductor doped with an n-type impurity or may be an n-type nitride semiconductor layer.

As illustrated in FIG. 1, the first conductivity type semiconductor layer 115 has a first edge S1, a second edge S2, a third edge S3, and a fourth edge S4. Accordingly, the first and third edges S1 and S3 may oppose each other, and the second and fourth edges S2 and S4 may oppose each other.

The second conductivity type semiconductor layer 125 may be formed of a semiconductor doped with a p-type impurity, and may be a p-type nitride semiconductor layer.

In another example embodiment, the first and second conductivity type semiconductor layers 115 and 125 may be stacked such that positions thereof are interchangeable. The first and second conductivity type semiconductor layers 115 and 125 may have an empirical formula of Al$_x$In$_y$Ga$_{(1-x-y)}$N, where 0≤x≤1, 0≤y≤1, and 0≤x+y≤1, and, for example, materials such as GaN, AlGaN, InGaN, and AlInGaN correspond thereto.

The active layer 120 may be interposed between the first and second conductivity type semiconductor layers 115 and 125. The active layer 120 may emit light having predetermined energy according to recombination of electrons and holes when the semiconductor light emitting device 10 operates. The active layer 120 may include a material having an energy band gap narrower than energy band gaps of the first and second conductivity type semiconductor layers 115 and 125. For example, when the first and second conductivity-type semiconductor layers 115 and 125 are GaN-based compound semiconductors, the active layer 120 may include an InGaN-based compound semiconductor having an energy band gap narrower than an energy band gap of GaN. In addition, the active layer 120 may have a multi-quantum well (MQW) structure in which quantum well layers and quantum barrier layers are alternately stacked, for example, an InGaN/GaN structure. However, the inventive concept is not limited thereto and the active layer 120 may have a single quantum well (SQW) structure.

The light emitting structure 110 may include a recess region E in which portions of the second conductivity type semiconductor layer 125, the active layer 120, and the first conductivity type semiconductor layer 115 are etched, and a mesa region M around the recess region E. In the drawings, the reference letter "B" may denote a boundary B between the recess region E and the mesa region M. A top surface of the mesa region M may be higher than a top surface of the recess region E. In an example, the mesa region M may be gradually narrowed upwardly. Accordingly, the mesa region M may have a sloped side surface.

In an example, a portion of the top surface of the recess region E may be defined as a first contact region CT1. In an example, at least a portion of the top surface of the mesa region M may be defined as a second contact region CT2.

The mesa region M may be spaced apart from the first to fourth edges S1 to S4, and the recess region E may be disposed between the mesa region M and the first to fourth edges S1 to S4. Also, recess regions E having a circular shape and being spaced apart from each other may further be arranged in a central portion of the light emitting structure 110.

The transparent electrode layer 140 may be disposed on the second conductivity type semiconductor layer 125 of the light emitting structure 110. The transparent electrode layer 140 may be disposed in the second contact region CT2 of the second conductivity type semiconductor layer 125, and may be electrically connected to the second conductivity type semiconductor layer 125. The transparent electrode layer 140 is used to spread a current injected from an outside across an upper surface of the second conductive type semiconductor layer 125.

The first insulating layer 130 may be disposed on the transparent electrode layer 140. The first insulating layer 130 may cover a portion of the first conductivity type semiconductor layer 115 and a portion of the second conductivity type semiconductor layer 125. The first insulating layer 130 may include a plurality of holes PD located in the mesa region M. The first insulating layer 130 may partially cover the transparent electrode layer 140 in the mesa region M. In the present embodiment, it is illustrated that the plurality of holes PD are arranged in a hexagonal close packed (HCP) lattice pattern but the inventive concept is not limited thereto. For example, the plurality of holes PD may be arranged in various forms such as a rectangular grid form. It is illustrated that the plurality of holes PD have a circular cross-section but the inventive concept is not limited thereto. For example, the plurality of holes PD may have a polygonal or annular cross section.

For example, the transparent electrode layer 140 may include at least one selected from among indium tin oxide (ITO), zinc-doped indium tin oxide (ZITO), gallium indium oxide (GIO), zinc tin oxide (ZTO), fluorine-doped tin oxide (FTO), aluminum-doped zinc oxide (AZO), gallium-doped zinc oxide (GZO), $In_4Sn_3O_{12}$, and $Zn_{(1-x)}Mg_xO$ (zinc magnesium oxide (ZMO), where $0 \leq x \leq 1$). A thickness of the transparent electrode layer 140 may range from 1 to 5 nm but is not limited thereto.

For example, the first insulating layer 130 may include at least one selected from the group consisting of $SiO_2$, SiN, $SiO_xN_y$, $TiO_2$, $Si_3N_4$, $Al_2O_3$, TiN, AlN, $ZrO_2$, TiAlN, TiSiN, HfO, $NbO_2$, $TaO_2$, and $MgF_2$.

In an example embodiment, the first insulating layer 130 may have a multi-layered structure in which a plurality of insulating films having different refractive indices are alternately stacked, and may be provided as a distributed Bragg reflector (DBR). The multi-layered structure may be a structure in which a first insulating film and a second insulating film having a first refractive index and a second refractive index, different from the first refractive index, are alternately stacked.

In another example embodiment, the first insulating layer 130 may be formed of a material having a refractive index lower than that of the second conductivity type semiconductor layer 125, and may form an omni-directional reflector (ODR) with the reflective electrode layer 144 disposed thereon and in contact therewith.

The first insulating layer 130 may be used alone or in combination with the reflective electrode layer 144 as a reflective structure for increasing reflectivity of light emitted from the active layer 120, and light extraction efficiency may be significantly improved.

In the present embodiment, a first transparent protective layer 135 may be disposed between the transparent electrode layer 140 and the first insulating layer 130. The first transparent protective layer 135 employed in the present embodiment may reduce physical impacts (e.g., plasma damage) applied to the second conductivity type semiconductor layer 125 (for example, p-type GaN layer) in the process of forming the plurality of holes PD in the first insulating layer 130 (this will be described hereinafter with reference to FIGS. 4A to 4C and FIGS. 6A to 6C). Accordingly, a degradation of electrical properties (Vr or Jr) due to a leakage current of the semiconductor light emitting element 10 may be prevented.

The first transparent protective layer 135 may be formed of an insulating material having a refractive index equal to or lower than that of the second conductivity type semiconductor layer 125 to strengthen total reflection characteristics. When the first insulating layer 130 has a multi-layered structure of a plurality of insulating films, the first transparent protective layer 135 may have a lower refractive index than at least an insulating firm, among the plurality of insulating films, which is disposed the closes to the first transparent protective layer 135. In an example, the first transparent protective layer 135 may be formed of a material having a refractive index equal to or lower a refractive index of a material of the first insulating layer 130. For example, the first transparent protective layer 135 may include at least one of $SiO_2$ and $MgF_2$. In an example embodiment, although the first insulating layer 130 is designed with a DBR structure, the first insulating layer may be designed to be thinner, preventing cracking in a folded region located at an edge of the mesa region to improve reliability. A thickness of the first transparent protective layer 135 may range from 10 nm to 200 nm but is not limited thereto.

The first transparent protective layer 135 may include the same material as that of at least a portion of the first insulating layer 130. For example, when the first insulating layer 130 is formed of a 13BR including a $SiO_2$ film, the first transparent protective layer 135 may be formed of $SiO_2$. Although the first transparent protective layer 135 is formed of the same material as that of at least a portion of the first insulating layer 130, it is not required to have a high film quality such as that of the insulating film of DBR, and thus, the first insulating layer 130 and the first transparent protective layer 135 may be formed through different processes. An interface of the first transparent protective layer 135 with respect to the first insulating layer 130 may be visually distinguished (e.g., a TEM photograph).

The reflective electrode layer 144 may be disposed on the first insulating layer 130 so as to be electrically connected to the transparent electrode layer 140 through the plurality of holes PD. For example, the reflective electrode layer 144 may include Ag, Cr, Ni, Ti, Al, Rh, Ru, Au, or any combination thereof.

In addition, a bonding electrode layer 142 may be disposed between the first insulating layer 130 and the reflective electrode layer 144. The bonding electrode layer 142 may be in contact with the transparent electrode layer 140 through the plurality of holes PD. The bonding electrode layer 142 may improve bonding properties between the reflective electrode layer 144 and the first insulating layer 130.

For example, the bonding electrode layer 142 may be formed of a material similar to that of the transparent electrode layer 140. For example, the bonding electrode layer 142 may include at least one selected from the group consisting of ITO, ZITO, ZIO, GIO, ZTO, FTO, AZO, GZO, $In_4Sn_3O_{12}$, and $Zn_{(1-x)}Mg_xO$ where, $0 \le x \le 1$.

The second transparent protective layer 138 may cover an upper surface and a side surface of the reflective electrode layer 144 to protect the reflective electrode layer 144. The second transparent protective layer 138 may cover a side surface of the bonding electrode layer 142. By forming the second transparent protective layer 138, the adhesion properties (or bonding characteristics) of the reflective electrode layer 144 may be improved and migration of a metal element forming the reflective electrode layer 144 may be suppressed.

The second transparent protective layer 138 may be formed of a transparent conductive material or a transparent insulating material. The transparent conductive material may include at least one selected from the group consisting of ZITO, ZIO, GIO, ZTO, FTO, AZO, GZO, $In_4Sn_3O_{12}$, and $Zn_{(1-x)}Mg_xO$ where $0 \le x \le 1$, or include a conductive polymer. The transparent insulating material may include at least one selected from the group consisting of $SiO_2$, SiN, $TiO_2$, HfO, $NbO_2$, $TaO_2$, and $MgF_2$.

The second insulating layer 150 may be disposed on the second transparent protective layer 138 and the first insulating layer 130.

Figure 3:
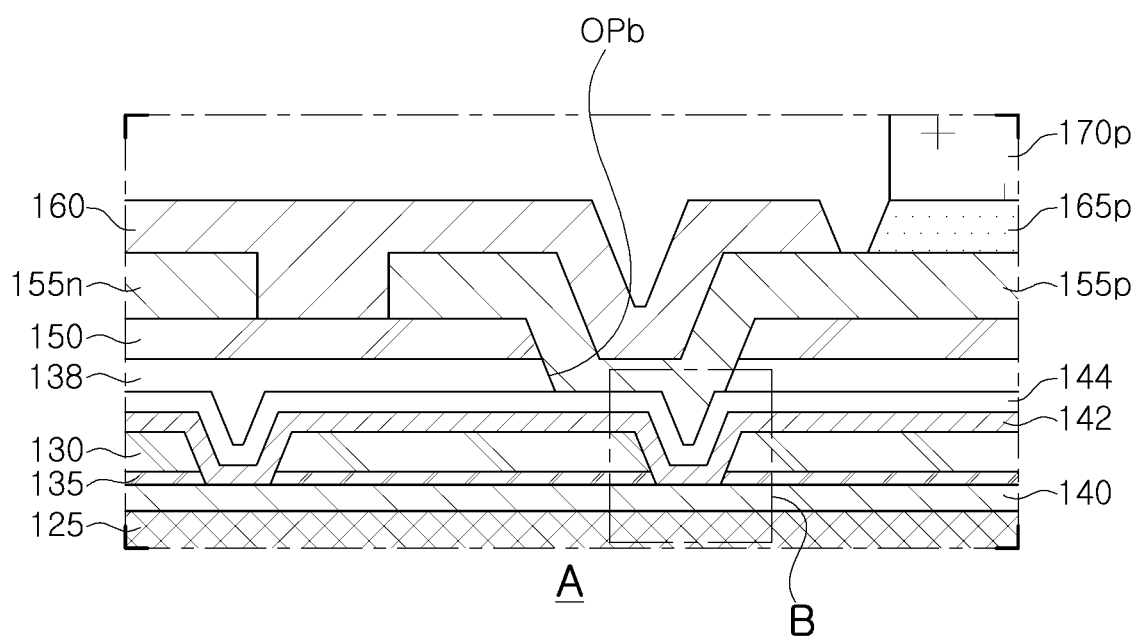
FIG. 3 is an enlarged partial cross-sectional view of portion "A" of FIG. 2.

Referring to FIG. 3 which shows a portion "A" of FIG. 2 in detail, in a case in which the second transparent protective layer 138 is formed of a transparent insulating material, a first opening OPa exposing the first contact region CT1 of the first conductivity type semiconductor layer 115 and a second opening OPb exposing a third region CT3 of the reflective electrode layer 144, by penetrating through the first insulating layer 130 and the second insulating layer 150, may be formed. The first opening OPa may be positioned in the recess region E and the second opening OPb may be positioned in the mesa region M.

The first connecting electrode 155n may be disposed on the second insulating layer 150 and extend to the first contact region CT1 of the first conductivity type semiconductor layer 115 through the first opening OPa so as to be electrically connected to the first conductivity type semiconductor layer 115. The first connecting electrode 155n may be in contact with the first contact region CT1 of the first conductivity type semiconductor layer 115. In an example, in order to improve contact resistance characteristics between the first connecting electrode 155n and the first contact region CT1 of the first conductivity type semiconductor layer 115, a conductive buffer layer may be disposed between the first connecting electrode 155n and the first contact region CT1 of the first conductivity type semiconductor layer 115.

The second connecting electrode 155p may be disposed on the second insulating layer 150 and extend to the third contact region CT3 of the reflective electrode layer 144 through the second opening OPb so as to be electrically connected to the reflective electrode layer 144. Accordingly, the second connecting electrode 155p may be electrically connected to the second conductivity type semiconductor layer 125 through the reflective electrode layer 144.

Alternatively, in a case in which the second transparent protective layer 138 is formed of a transparent conductive material, the second opening OPb penetrating through the second insulating layer 150 may be formed such that the contact region of the second transparent protective layer 138 is exposed. The second connecting electrode 155p may be disposed on the second insulating layer 150 and may be connected to the second transparent protective layer 138 through the second opening OPb so as to be electrically connected to the reflective electrode layer 144 and the second conductivity type semiconductor layer 125.

The first connecting electrode 155n and the second connecting electrode 155p may be disposed on the second insulating layer 150, may be formed of the same material, and separated from each other.

When viewed from the plane (i.e., in a plan view), the first connecting electrode 155n may be adjacent to the first edge S1 and the second connecting electrode 155p (also known as a 'connecting electrode') may be adjacent to the third edge S3.

The third insulating layer 160 may include a third opening 160a disposed in the first electrode 155n and exposing a fourth contact region CT4 of the first connecting electrode 155n and a fourth opening 160b disposed in the second connecting electrode 155p and exposing a fifth contact region CT5 of the second connecting electrode 155p.

For example, the first connecting electrode 155n and the second connecting electrode 155p may be formed of a material including one or more of materials such as Al, Au, W, Pt, Si, Jr, Ag, Cu, Ni, and alloys thereof.

A first electrode pad 165n may be disposed on the fourth contact region CT4 of the first connecting electrode 155n, and a second electrode pad 165p may be disposed on the fifth contact region CT5 of the second connecting electrode 155p. A first solder column 170n may be disposed on the first electrode pad 165n, and a second solder column 170p may be disposed on the second electrode pad 165p. The first and second solder columns 170n and 170p may be formed of a conductive material such as Sn, AuSn, or the like.

A molding portion 172 covering side surfaces of the first and second solder columns 170n and 170p may be formed. The molding portion 172 may include a light reflective powder such as $TiO_2$, $Al_2O_3$, and the like. An upper surface of the molding portion 172 may be lower than upper surfaces of the first and second solder columns 170n and 170p.

In another example, in the semiconductor light emitting device 10 illustrated in FIG. 2, the reflective electrode layer 144 may be disposed directly on the first insulating layer 130 without the bonding electrode layer 142. In addition, the second transparent protective layer 138 may also be omitted as necessary. In another example, a capping electrode layer disposed on the reflective electrode layer 144 may be further provided. The capping electrode layer may have a multi-layer structure in which Ti and Ni are alternately stacked.

In the electrode structure employed in the present embodiment, since the transparent electrode layer 140 in ohmic contact with the second conductivity type semiconductor layer 125 is first formed and the reflective electrode layer 144 is provided on the first insulating layer 130, a process of patterning the first insulating layer 130 or forming the holes PD is required to connect the reflective electrode layer 144 and the transparent electrode layer 140 to inject a current to the transparent electrode layer 140.

Such a process may be realized in two ways. In an example (please see FIGS. 4A to 4C), the first insulating layer 130 may be patterned through an etching process using dry etching after the first insulating layer 130 is entirely deposited. In another example (please see FIGS. 6A to 6C), after a photoresist pattern M2 corresponding to the contact region is formed, the first insulating layer 130 may be entirely deposited and the photoresist pattern M2 may be lifted to realize a desired pattern.

Figure 4A:
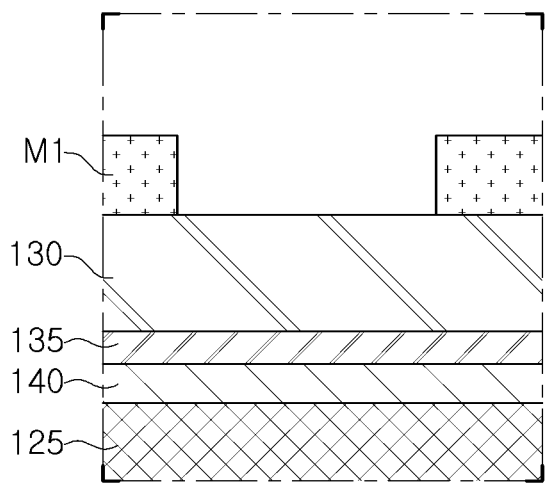
FIGS. 4A to 4C are cross-sectional views illustrating a process of forming a hole in a method of manufacturing a semiconductor light emitting device according to an example embodiment.

In an example, as illustrated in FIG. 4A, the first insulating layer 130 may be entirely deposited on the first transparent protective layer 135. The first insulating layer 130 may be realized as a DBR in which two kinds of insulating films having different refractive indices are alternately stacked. In this case, a plasma-enhanced chemical vapor deposition (PE-CVD) process may be performed, and a damage to an interface between the second conductivity type semiconductor layer 125 and the transparent electrode layer 140 due to plasma may be alleviated by the first transparent protective layer 135.

Figure 4B:
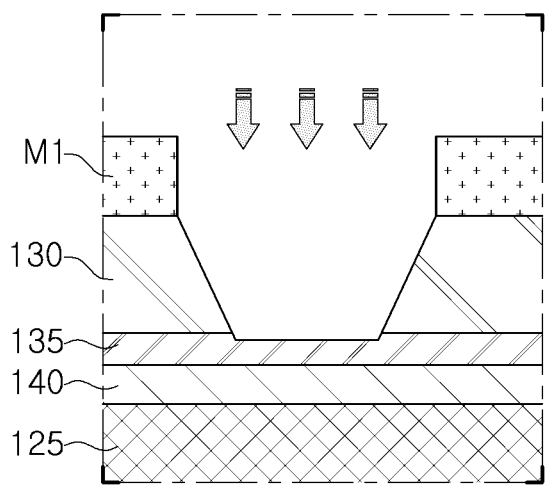

Referring to FIG. 4B, an etching process such as dry etching may be performed using the photoresist pattern M1 to form a hole. The first insulating layer 130 may be subjected to a first etching process using reaction and process conditions for etching the DBR structure. As the first etching process, predetermined over-etching (e.g., 20% to 30%) may be performed to prevent the first insulating layer 130 from remaining. In this case, in a case in which the first transparent protective layer 135 is not present, the transparent electrode layer 140 (for example, 1 to 5 nm), thinner than the first insulating layer 130 (e.g., 1000 nm or less) such as the DBR, may be etched to be opened so the interface between the second conductivity type semiconductor layer 125 and the transparent electrode layer 140 may be seriously damaged to deteriorate the characteristics of the device. However, a damage due to overetching in the first etching process may be prevented by the first transparent protective layer 135.

Figure 4C:
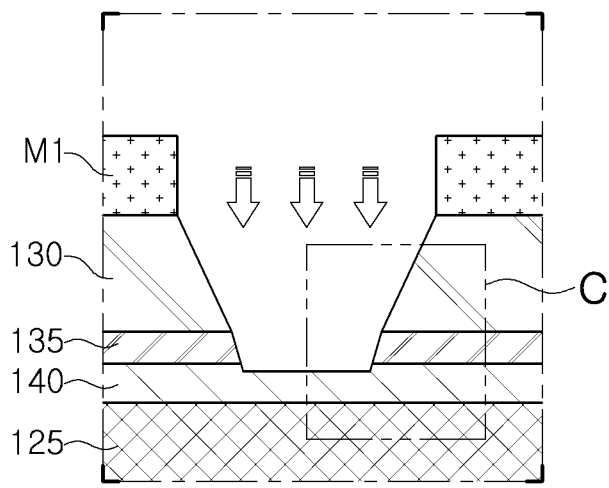

Thereafter, referring to FIG. 4C, the first transparent protective layer 135 exposed to the hole may be etched to expose the transparent electrode layer 140. A second etching process for the first transparent protective layer 135 may be performed under different process conditions (e.g., no plasma or using a different etching gas) causing a less physical damage, and an undesired damage or etching to the transparent electrode layer 140 may be minimized by minimizing an overetching time.

Since the etching process according to the example embodiment is performed as the two-stage etching process, an inner wall of the obtained hole may have a unique shape.

Figure 5:
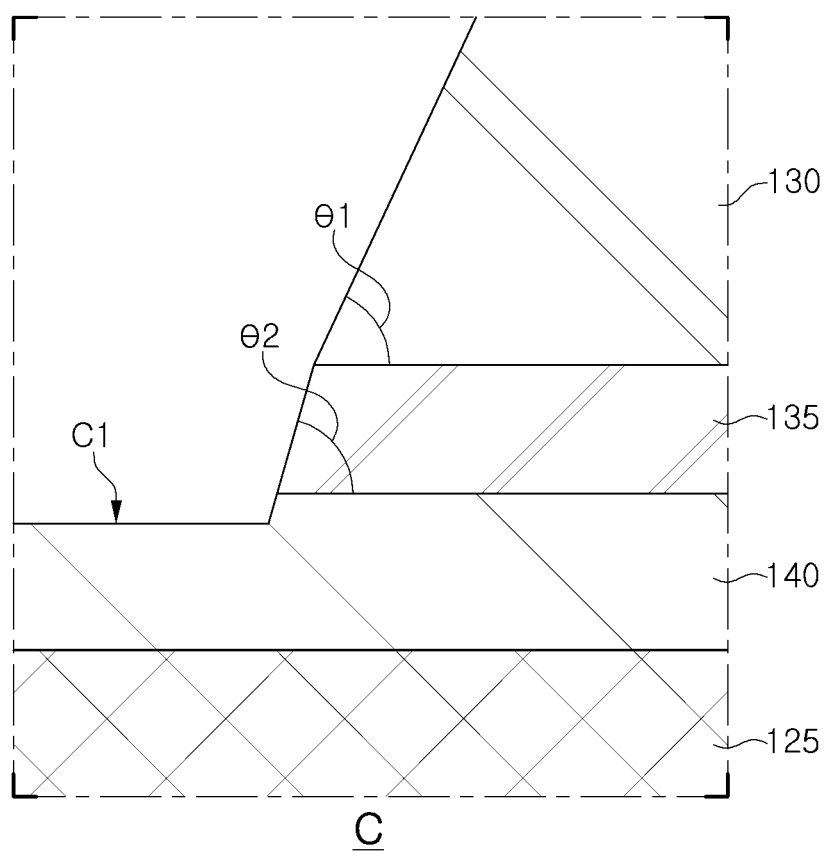
FIG. 5 is an enlarged partial cross-sectional view of a portion indicated "C" in FIG. 4B.

FIG. 5 is an enlarged partial cross-sectional view of portion "C" in FIG. 4C.

The hole illustrated in FIG. 5 has a first inner wall surrounded by the first insulating layer 130 and a second inner wall surrounded by the first transparent protective layer 135, and an inclination angle θ1 of the first inner wall and an inclination angle θ2 of the second inner wall may be different from each other. As in the present embodiment, the inclination angle θ1 of the first inner wall may be smaller than the inclination angle θ2 of the second inner wall.

The second inner wall may extend to a portion of the transparent electrode layer 140. The contact region C1 of the transparent electrode layer 140 connected to the hole may have a level lower than other portions.

Figure 6A:
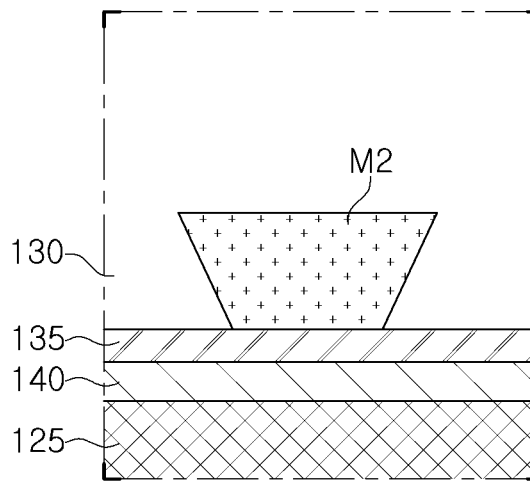
FIGS. 6A to 6C are cross-sectional views illustrating a process of forming a hole in a method of manufacturing a semiconductor light emitting device according to an example embodiment.

In another example, as illustrated in FIG. 6A, a photoresist pattern M2 corresponding to the contact region is formed on the first transparent protective layer 135.

Figure 6B:
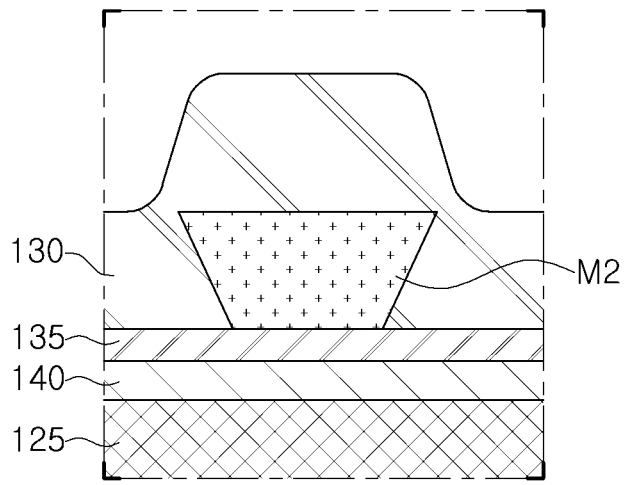

Subsequently, referring to FIG. 6B, the first insulating layer 130 such as a DBR is entirely deposited on the first transparent protective layer 135 on which the photoresist pattern M2 is formed. For example, in a case in which the first insulating layer 130 is formed using the PE-CVD process, a damage to the interface between the second conductivity type semiconductor layer 125 and the transparent electrode layer 140 due to plasma may be reduced by virtue of the first transparent protective layer 135.

Figure 6C:
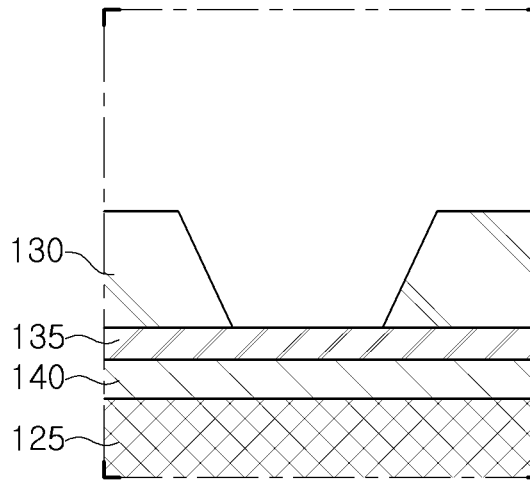

Thereafter, referring to FIG. 6C, in the case of a process of lifting off the photoresist pattern, a desired patterning process may be performed without physically damage due to plasma, or the like.

By forming the first transparent protective layer 135 on the transparent electrode layer 140 in this manner, ion-bombardment or a physical impact such as a damage to the second conductivity type semiconductor layer 125 (e.g., pGaN) located under the transparent electrode layer 140 may be minimized during the process of the patterning the first insulating layer 130 (hole formation process), thereby maintaining reliability of the device.

Further, by forming the first transparent protective layer 135 with a material (e.g., $SiO_2$, $MgF_2$) having a relatively low refractive index to strengthen total reflection characteristics, the first insulating layer 130 may be designed as a thinner DBR, whereby cracking of the first insulating layer 130 may be prevented.

In the semiconductor light emitting device in which the first insulating layer is formed to have the DBR structure, in a case in which the transparent protective layer was not applied, leakage current characteristics (especially, VR) were deteriorated as illustrated in Table 1 (i.e., deterioration of leakage (VR) characteristics). However, it can be seen that leakage current characteristics (VR, IR) were greatly improved by a dielectric material such as $MgF_2$ formed to have a low refractive index as a transparent protective layer as illustrated in Table 2 (substantially same level of leakage (VR, IR) characteristics as Ref.).

TABLE 1

| W/P | Comparative example 1 DBR (5 layers, 410 nm) | | | | Comparative example 2 DBR (7 layers, 480 nm) | | | |
|---|---|---|---|---|---|---|---|---|
| | Ref. | No. 1 | No. 2 | No. 3 | Ref. | No. 1 | No. 2 | No. 3 |
| Vf2 | 2.743 | 2.786 | 2.773 | 2.759 | 2.722 | 2.824 | 2.813 | 2.809 |
| Vf1 | 2.371 | 2.377 | 2.376 | 2.379 | 2.352 | 2.365 | 2.365 | 2.368 |
| VR | 26.1 | 9.7 | 10.8 | 12.7 | 25.4 | 7.1 | 7.4 | 7.6 |

TABLE 2

| W/P | Example 1 | | | | Example 2 | |
|---|---|---|---|---|---|---|
| | Ref. | 1.2K(DBR) | 0.8K(DBR) | 0.4K(DBR) | Ref. | 1.6K(DBR) |
| Vf2 | 2.732 | 2.753 | 2.750 | 2.740 | 2.745 | 2.777 |
| Vf1 | 2.293 | 2.292 | 2.299 | 2.289 | 2.291 | 2.291 |
| VR | 24.7 | 25.0 | 24.9 | 25.7 | 25.0 | 25.2 |
| IR | 0.005 | 0.005 | 0.005 | 0.006 | 0.005 | 0.006 |

Hereinafter, a method of manufacturing the semiconductor light emitting device 10 according to an example embodiment will be described with reference to FIGS. 7 to 20. FIGS. 7, 9, 11, 13, 15, 17, and 19 are schematic plan views illustrating a method of manufacturing the semiconductor light emitting device 10 according to an example embodiment, and FIGS. 8, 10, 12, 14, 16, 18, and 20 are cross-sectional views of regions taken along line I-I' of FIGS. 7, 9, 11, 13, 15, 17, and 19.

Figure 7:
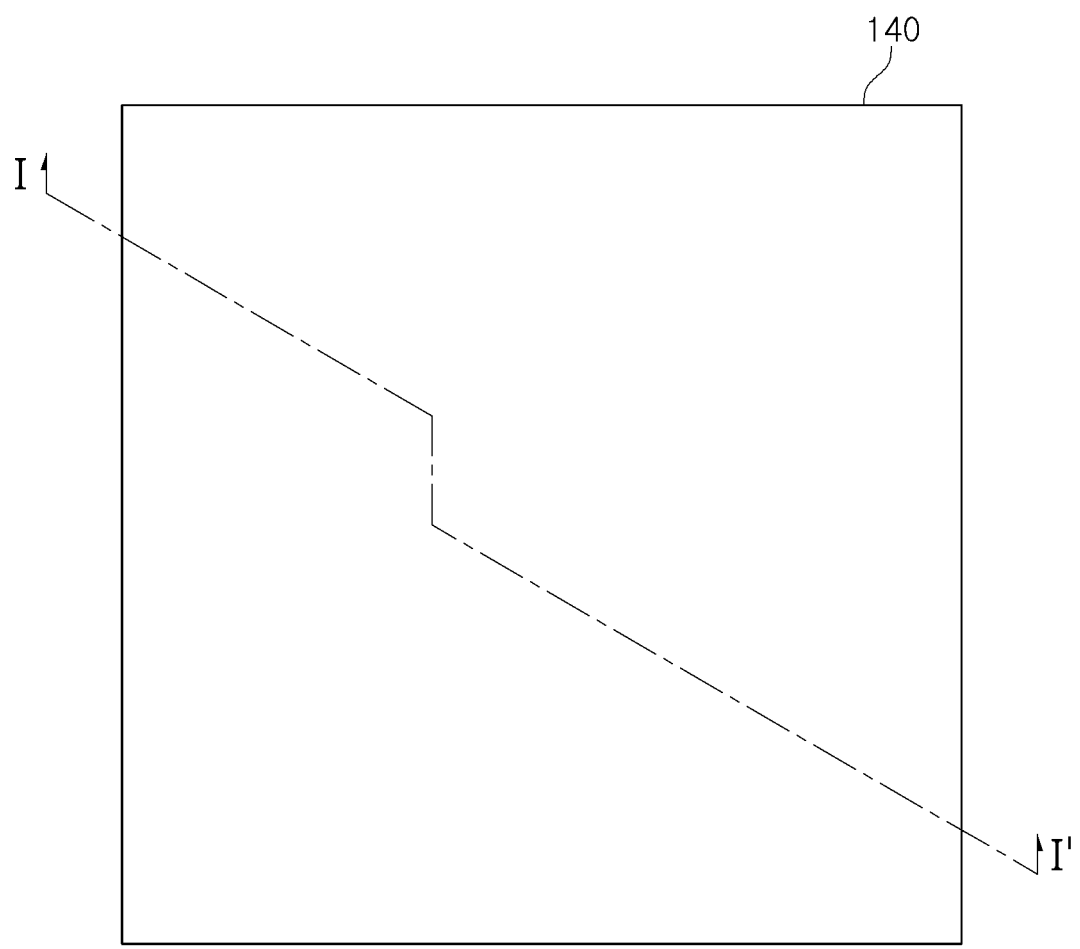
FIGS. 7, 9, 11, 13, 15, 17, and 19 are plan views illustrating a method of manufacturing a semiconductor light emitting device according to an example embodiment.
Figure 8:
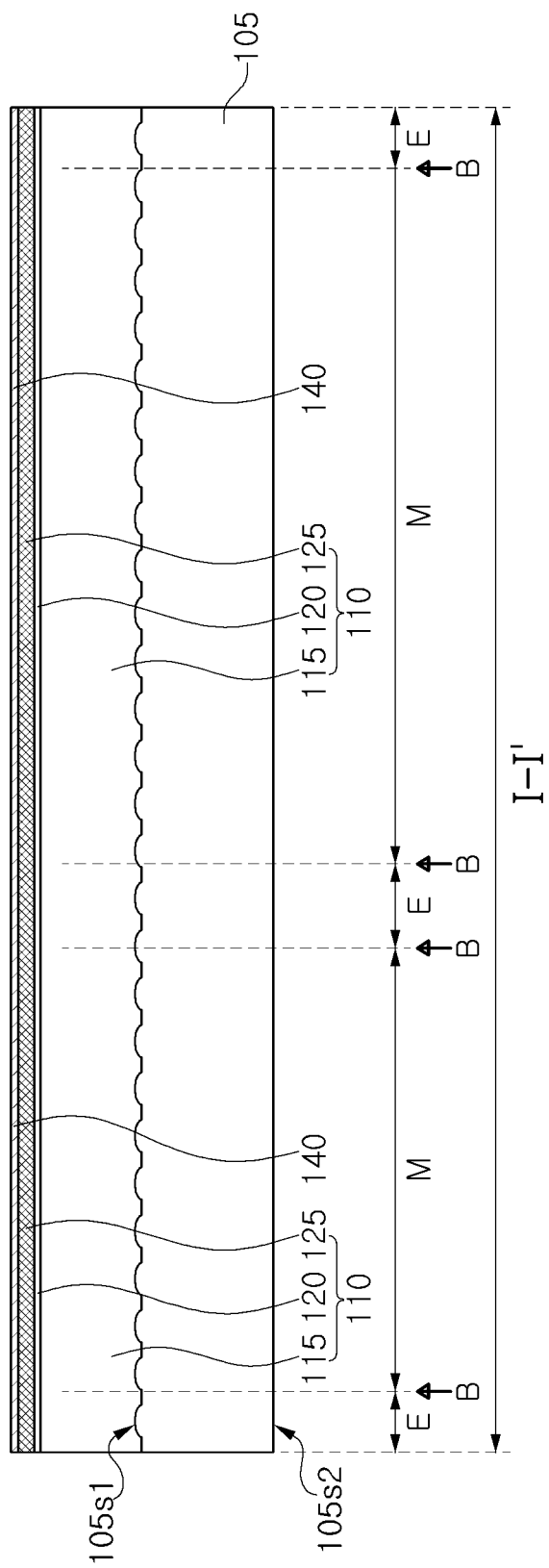
FIGS. 8, 10, 12, 14, 16, 18, and 20 are cross-sectional views illustrating a method of manufacturing a semiconductor light emitting device according to an example embodiment.

Referring to FIGS. 7 and 8, the light emitting structure 110 may be formed on the substrate 105. The substrate 105 may have the front surface 105s1 and the rear surface 105s2 opposing the front surface 105s1.

In an example, a concavo-convex structure may be formed on the front surface 105s1 of the substrate 105. According to an example embodiment, forming the concave-convex structure on the front surface 105s1 of the substrate 105 may be omitted.

The light emitting structure 110 may be formed on the front surface 105s1 of the substrate 105. The light emitting structure 110 may include a plurality of layers formed using a process such as metal organic chemical vapor deposition (MOCVD), hydride vapor phase epitaxy (HVPE), molecular beam epitaxy (MBE), and the like. For example, the light emitting structure 110 may include a first conductivity type semiconductor layer 115, an active layer 120, and a second conductivity type semiconductor layer 125 sequentially formed on the front surface 105s1 of the substrate 105. The first conductivity type semiconductor layer 115 and the second conductivity type semiconductor layer 125 may have different conductivity types. For example, the first conductivity type semiconductor layer 115 may have n-type conductivity, and the second conductivity type semiconductor layer 125 may have p-type conductivity. In addition, the transparent electrode layer 140 may be formed on the light emitting structure 110.

Figure 9:
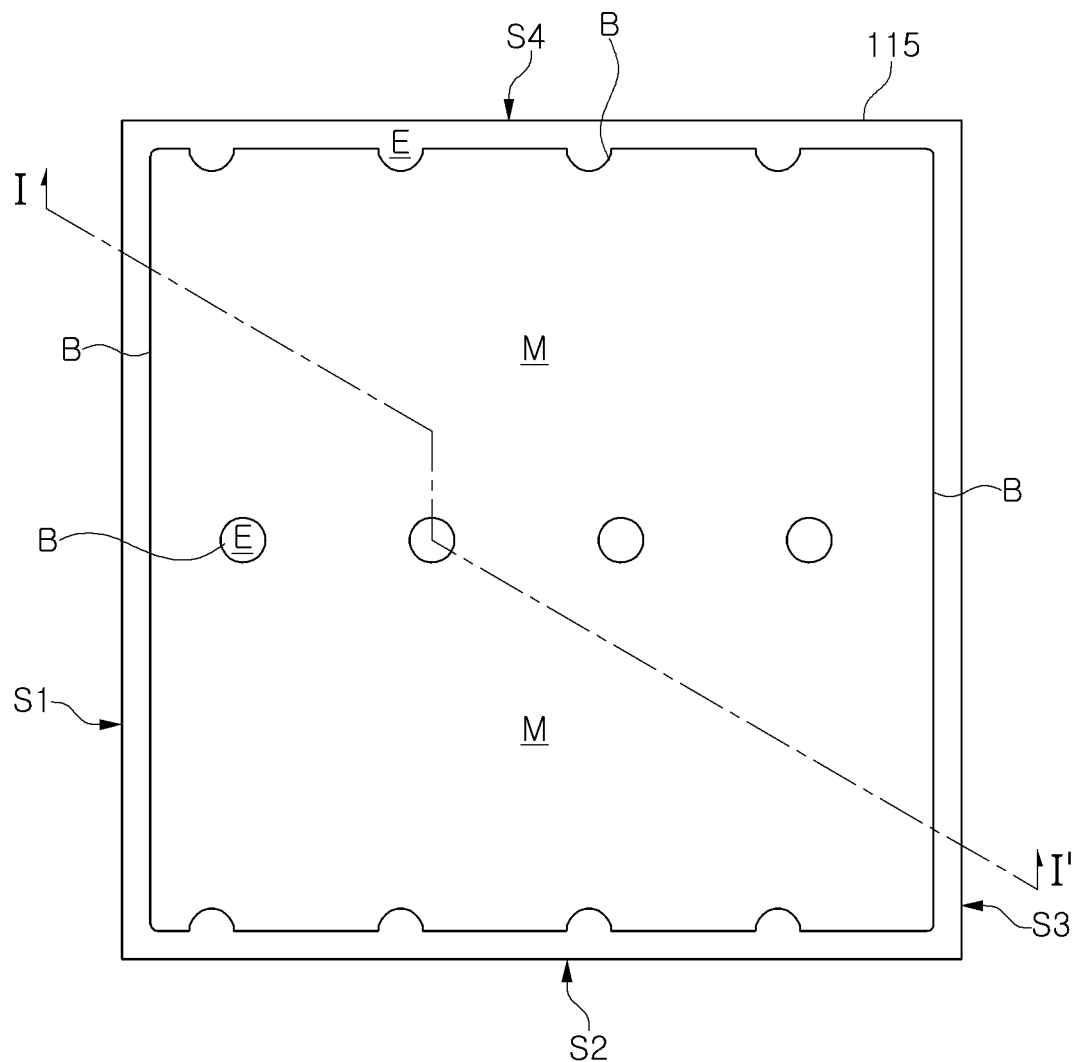
Figure 10:
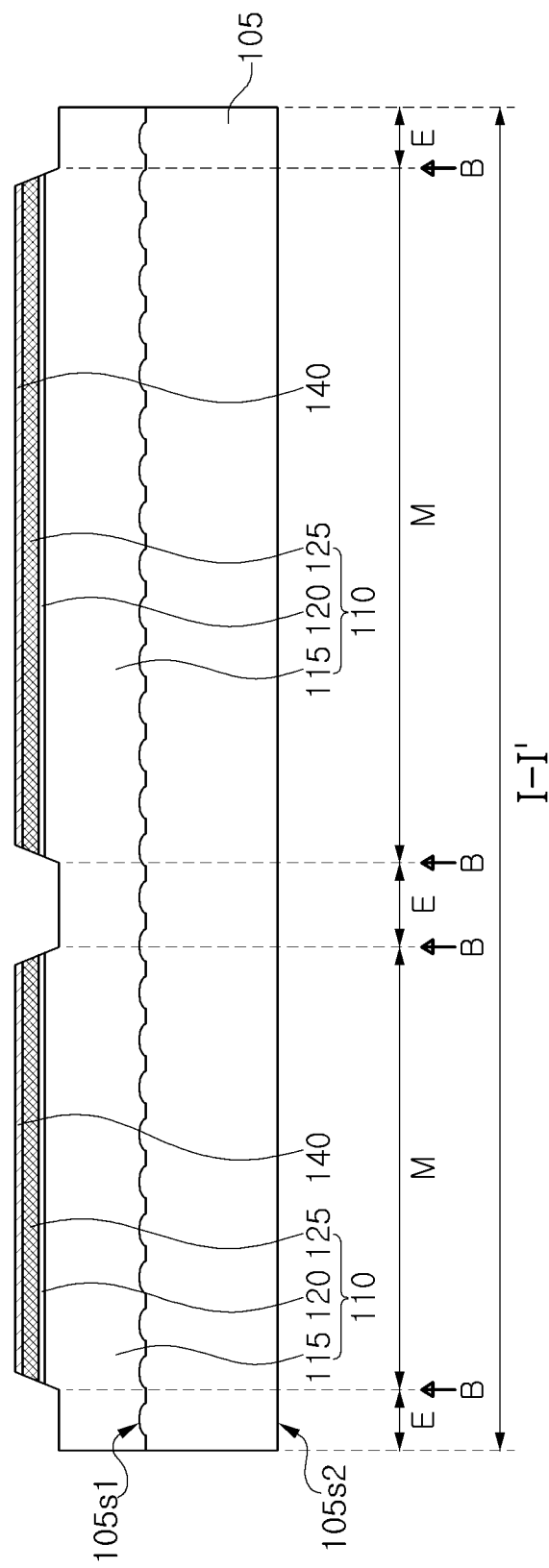

Referring to FIGS. 9 and 10, the transparent electrode layer 140, the second conductivity type semiconductor layer 125, the active layer 120, and the first conductivity type semiconductor layer 115 may be etched using a photolithography process. Accordingly, the light emitting structure 110 may include the recess region E formed by removing portions of the second conductivity type semiconductor layer 125, the active layer 120, and the first conductivity type semiconductor layer 115 and the mesa region (M) therearound. The mesa region M may be defined as a region in which the second conductivity type semiconductor layer 125, the active layer 120, and the first conductivity type semiconductor layer 115 are not etched. The mesa region M may have a protruding shape, relative to the recess region E. The recess region E may also be referred to as an etched region.

Figure 11:
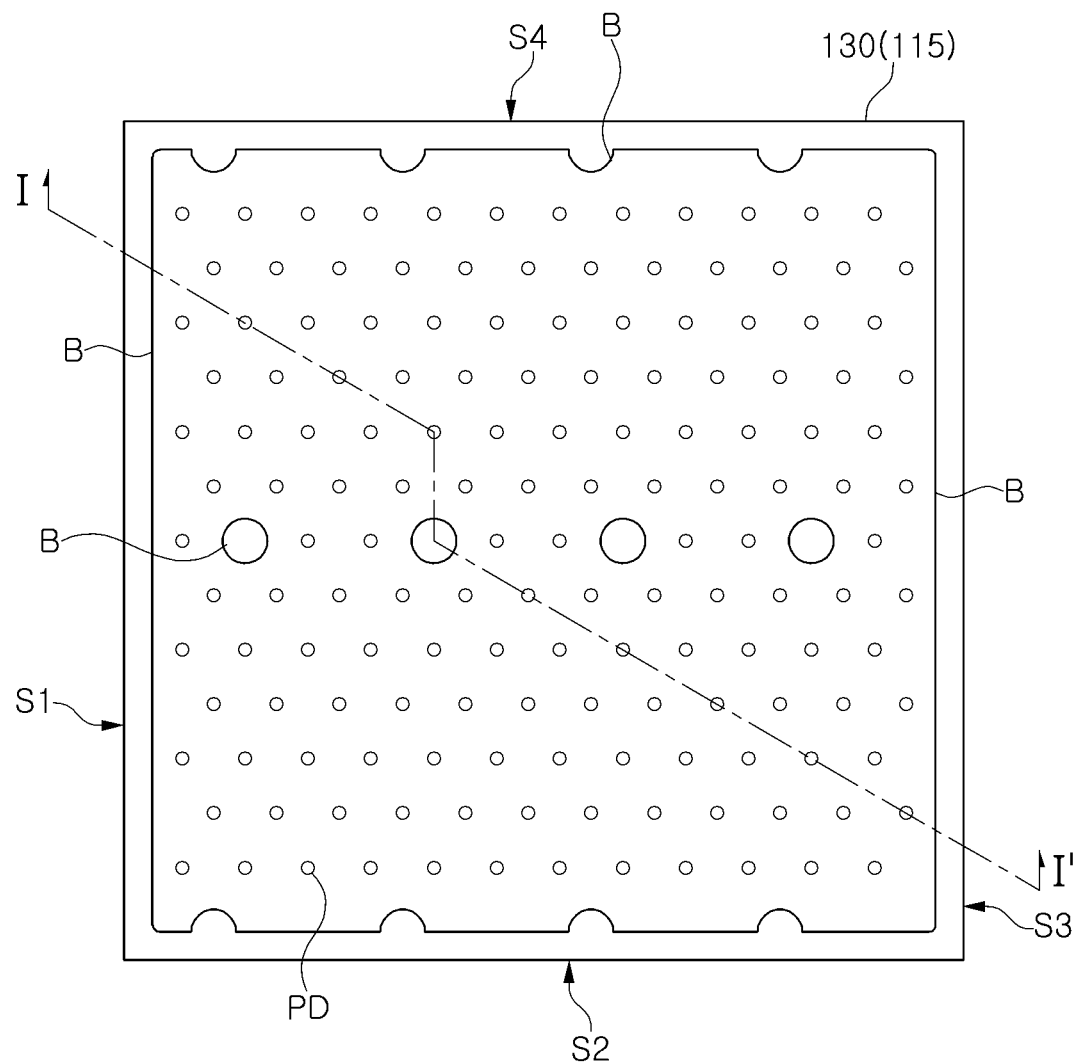
Figure 12:
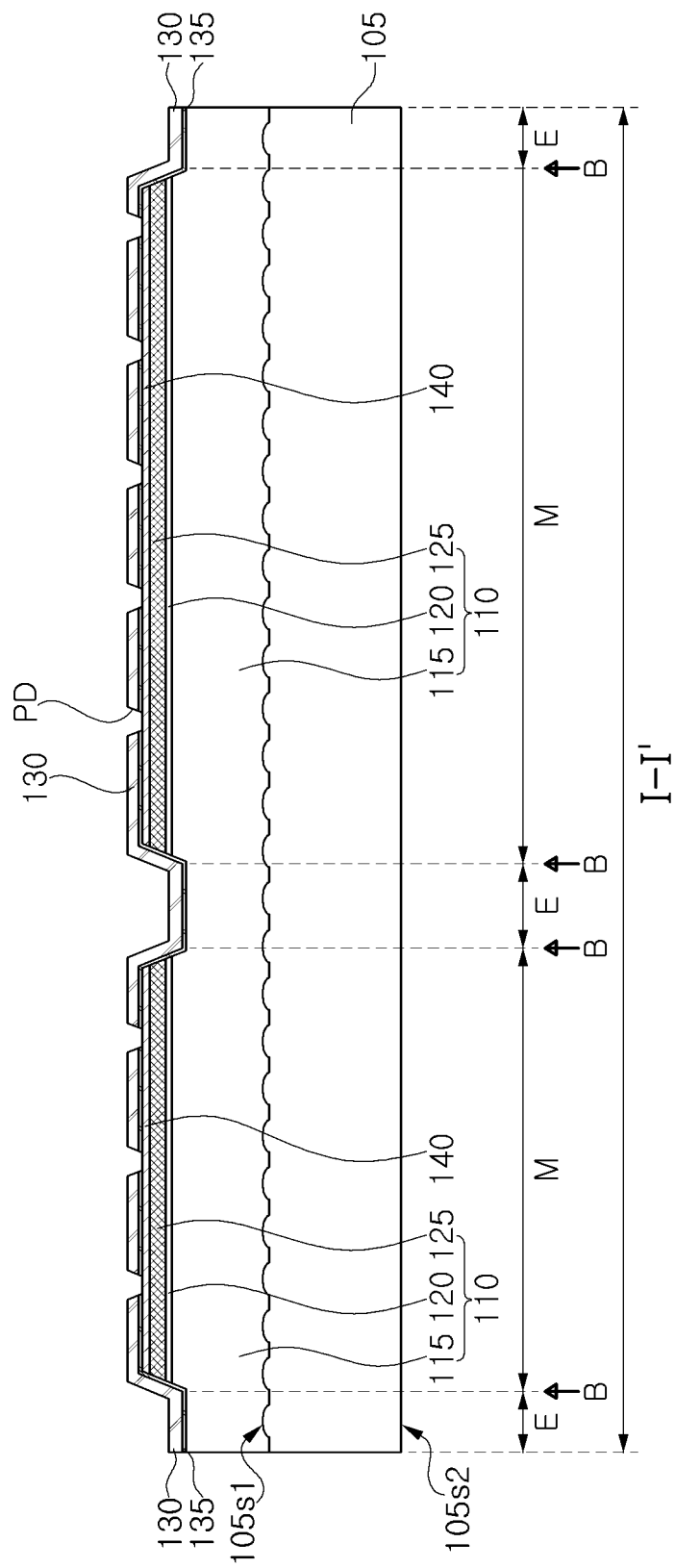

Referring to FIGS. 11 and 12, the first transparent protective layer 135 and the first insulating layer 130 having the plurality of holes PD may be formed on the light emitting structure 110.'

The first transparent protective layer 135 and the first insulating layer 130 are sequentially formed on the transparent electrode layer 140, and the plurality of holes PD may penetrate through the first insulating layer 130 and the first transparent protective layer 135 to expose portions of the transparent electrode layer 140. The plurality of holes PD may be located in the mesa region (M). Such a process may be formed through the patterning process illustrated in FIGS. 4A to 4C or FIGS. 6A to 6C. The first transparent protective layer 135 employed in the present embodiment may reduce a physical impacts (e.g., plasma damage) applied to the second conductivity type semiconductor layer 125 (e.g., p-type GaN layer) during this process, and, as a result, deterioration of electrical characteristics (Vr or Jr) due to a leakage current may be prevented.

Figure 13:
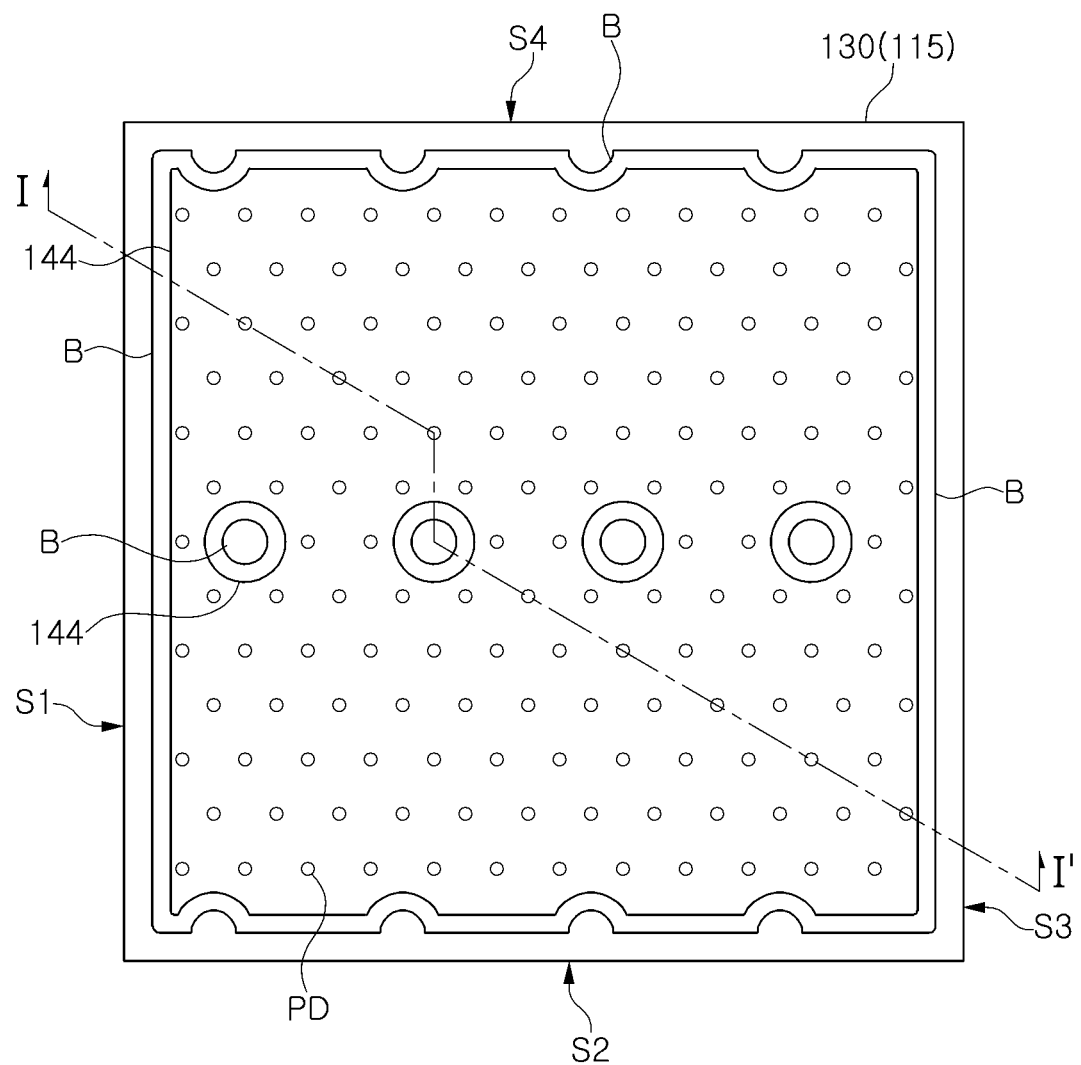
Figure 14:
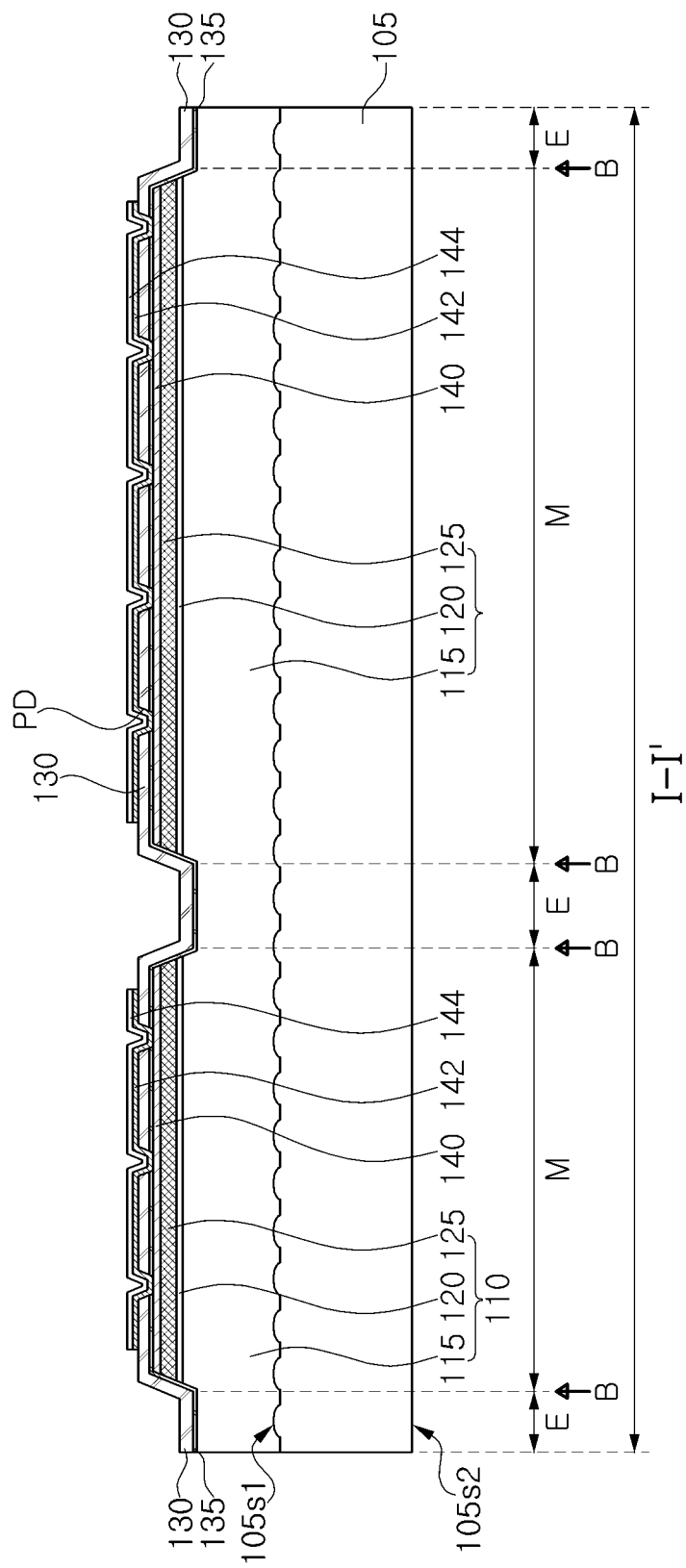

Referring to FIGS. 13 and 14, the bonding electrode layer 142 and the reflective electrode layer 144 may be formed on the first insulating layer 130. The bonding electrode layer 142 and the reflective electrode layer 144 may be formed on the mesa region M and may be formed on a region of the first insulating layer 130.

Figure 15:
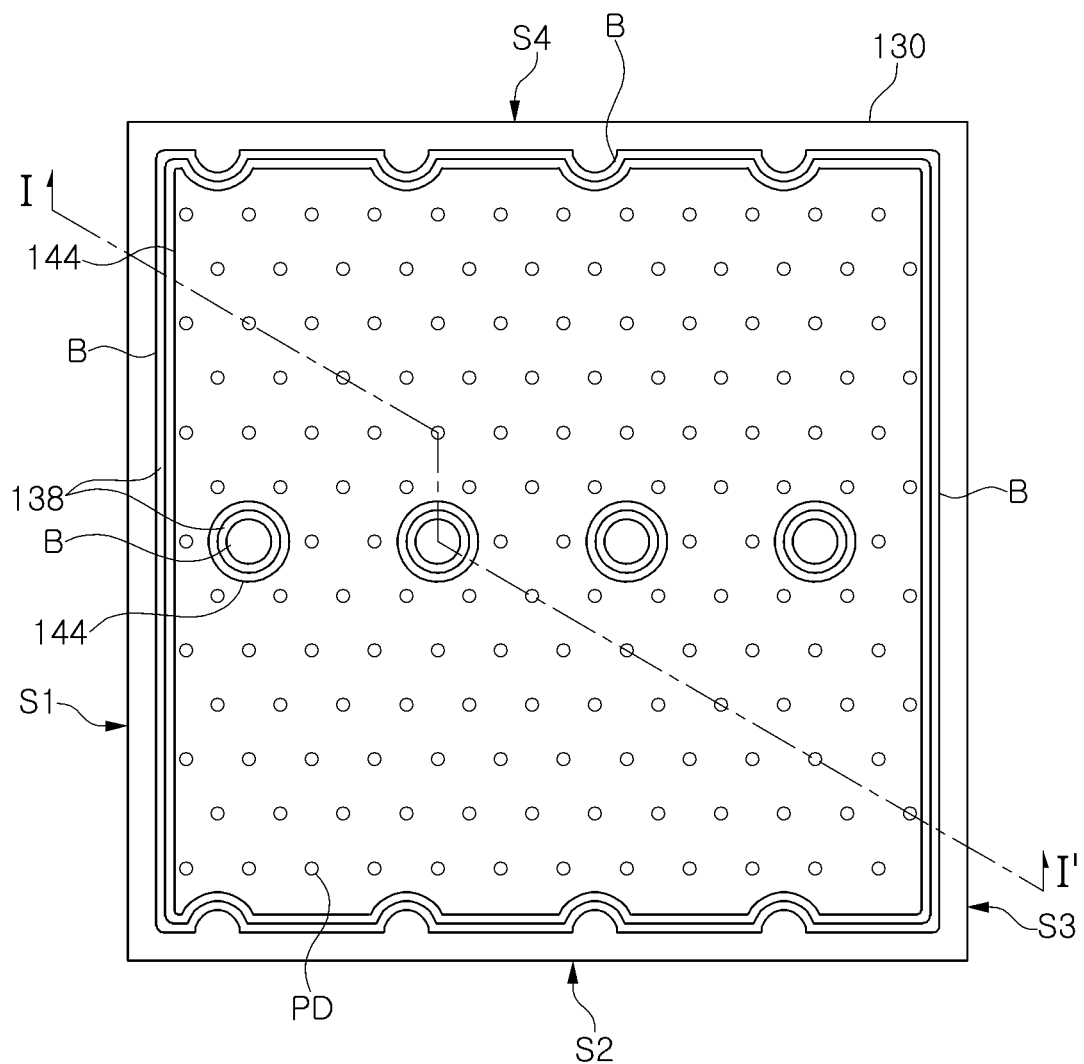
Figure 16:
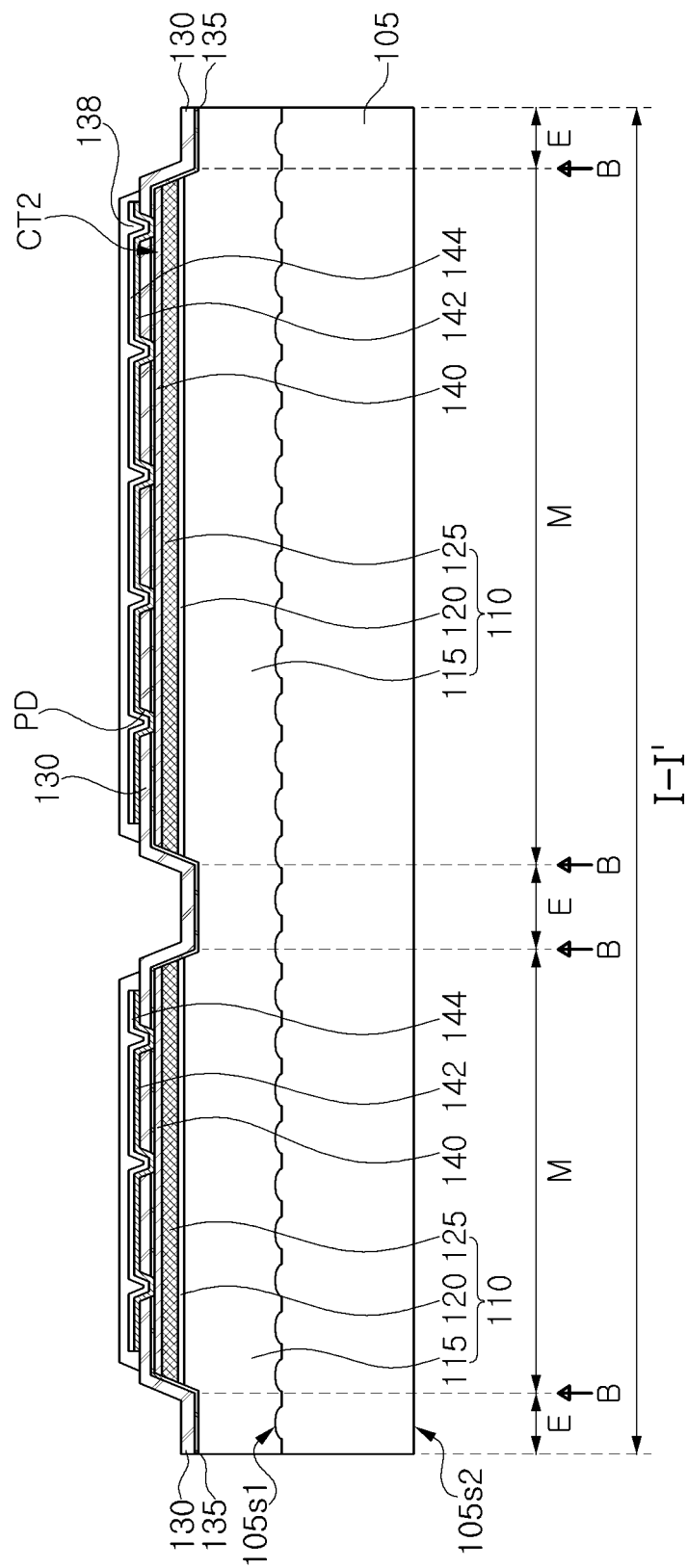

Referring to FIGS. 15 and 16, the second transparent protective layer 138 may be formed on the reflective electrode layer 144. The second transparent protective layer 138 may cover the upper surface and the side surface of the reflective electrode layer 144 and the side surface of the bonding electrode layer 142. The second transparent protective layer 138 may cover a portion of the first insulating layer 130 adjacent to the reflective electrode layer 144. For example, after forming a photoresist pattern exposing a region in which the second transparent protective layer 138 is to be formed, the second transparent protective layer 138 may be formed through a physical vapor deposition process such as sputtering.

Figure 17:
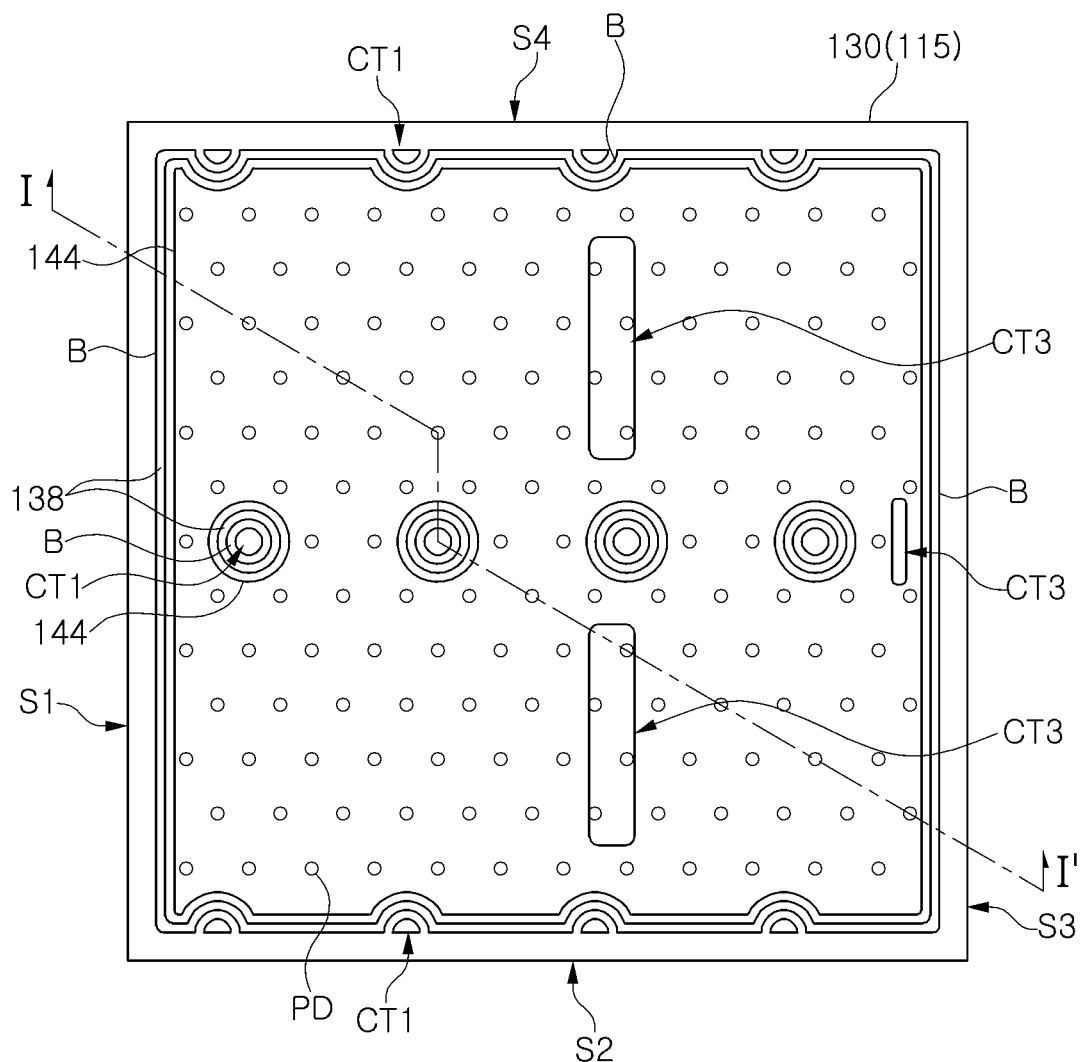
Figure 18:
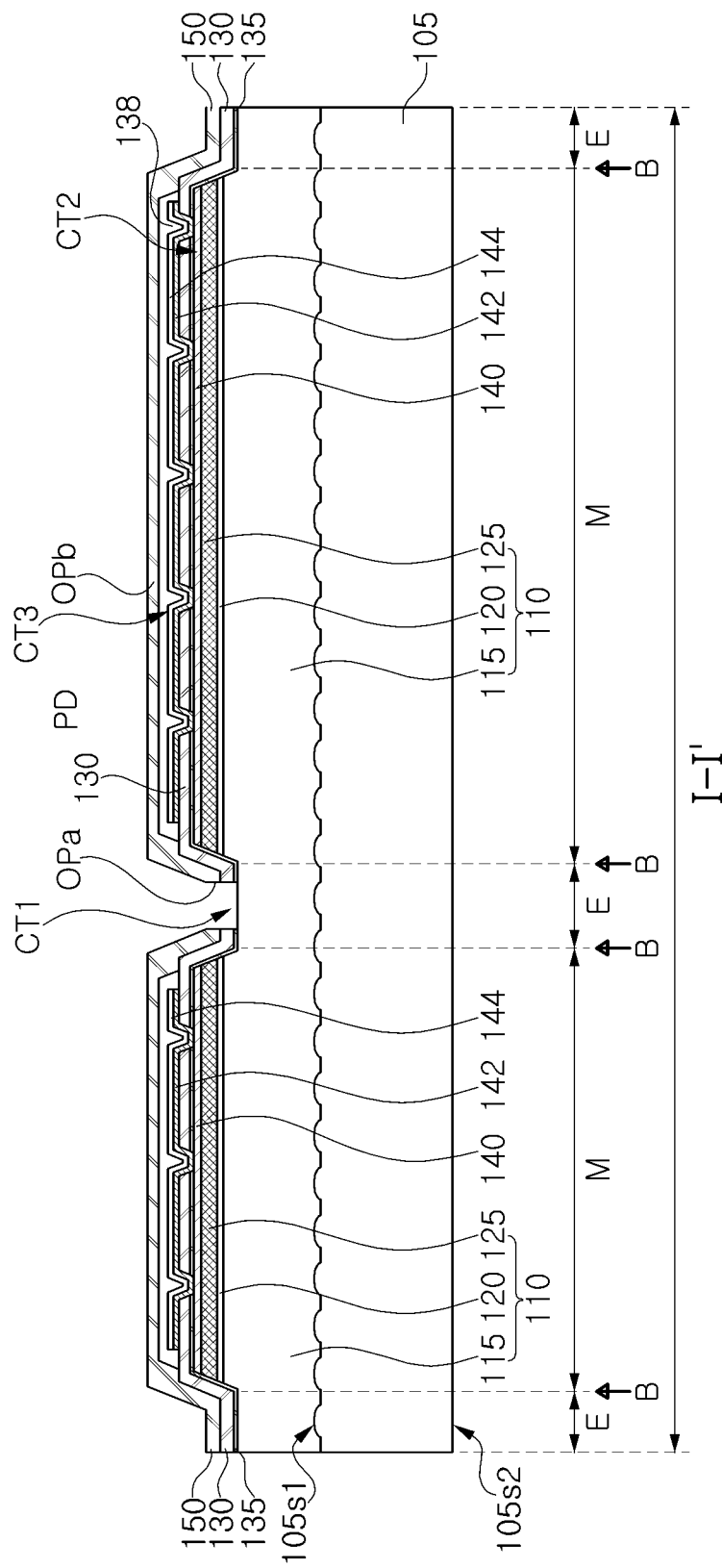

Referring to FIGS. 17 and 18, the second insulating layer 150 may be formed on the first insulating layer 130 and the second transparent protective layer 138.

The first opening OPa penetrating through the first insulating layer 130 and the second insulating layer 150 and exposing a portion of the first conductivity type semiconductor layer 115 in the recess region E and the second opening OPb penetrating through the second transparent protective layer 138 and the second insulating layer 150 and exposing a portion of the reflective electrode layer 144 of the mesa region M may be formed.

The surface of the first conductivity type semiconductor layer 115 exposed by the first opening OPa may be referred to as the first contact region CT1 and the surface of the surface of the reflective electrode layer 144 exposed by the second opening OPb may be referred to as the third contact region CT3.

Figure 19:
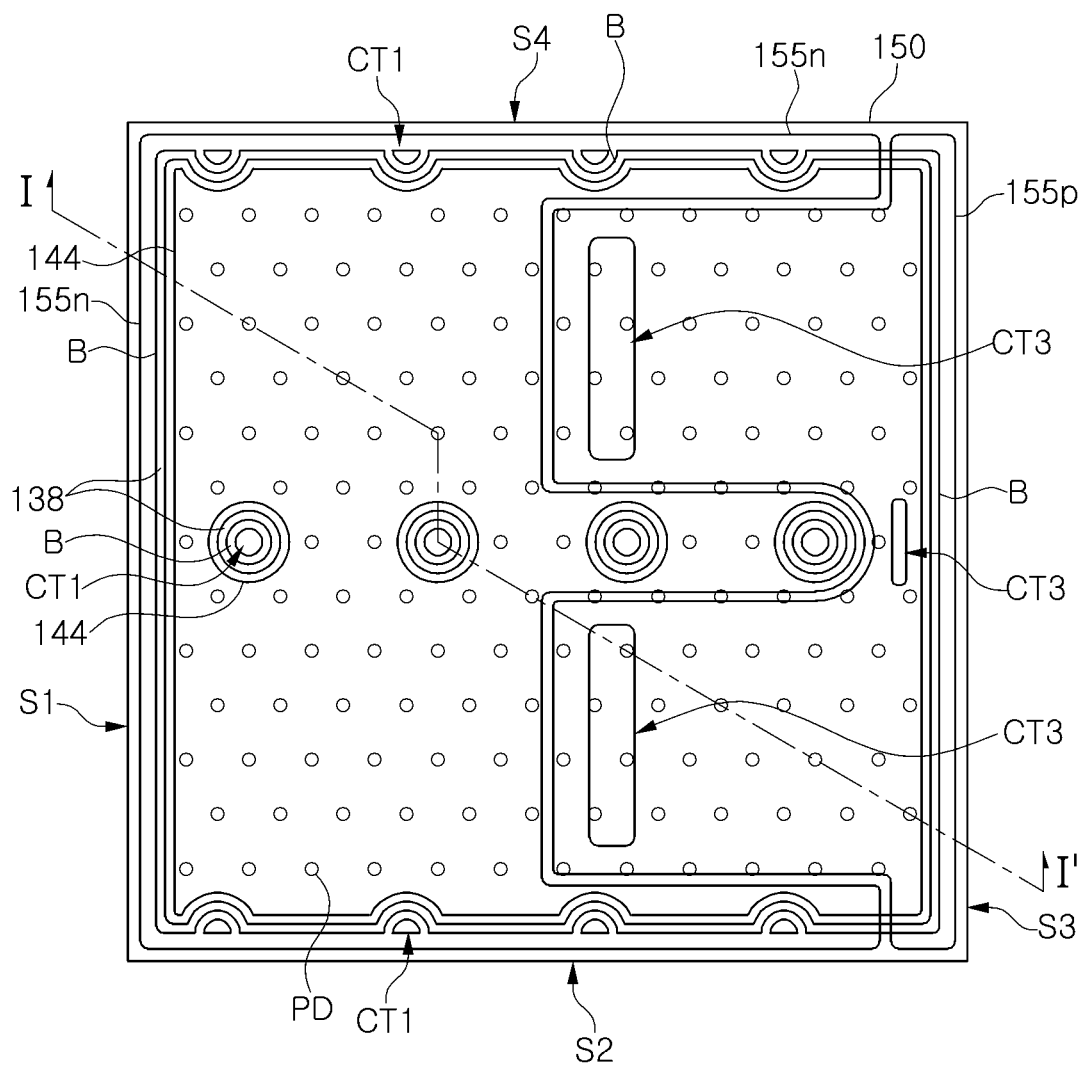
Figure 20:
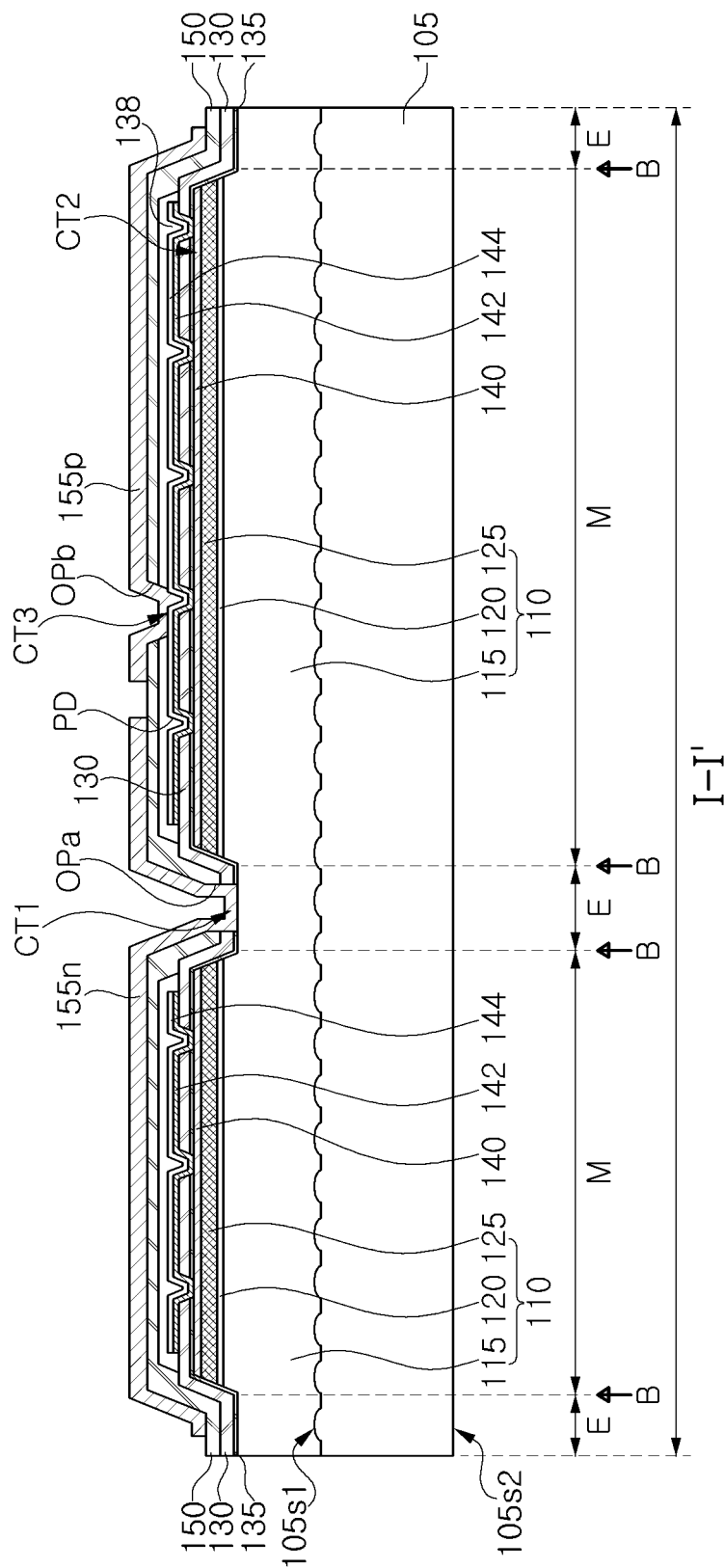

Referring to FIGS. 19 and 20, the first connecting electrode 155n and the second connecting electrode 155p may be formed on the substrate 105 having the second insulating layer 150.

The forming of the first connecting electrode 155n and the second connecting electrode 155p may include forming a conductive material layer on the substrate 105 having the second insulating layer 150 and etching a portion of the conductive material layer using a photolithography process. Since the first connecting electrode 155n and the second connecting electrode 155p are formed through the same process, they may be formed of the same material. The first connecting electrode 155n and the second connecting electrode 155p may have the same thickness.

The first connecting electrode 155n may be electrically connected to the first contact region CT1 of the first conductivity type semiconductor layer 115. The second connecting electrode 155p may be electrically connected to the third contact region CT3 of the reflective electrode layer 144.

Referring back to FIGS. 1 and 2, the third insulating layer 160 having the third opening 160a and the fourth opening 160b may be formed on the substrate 105 having the first connecting electrode 155n and the second connecting electrode 155p.

The third opening 160a of the third insulating layer 160 may expose a portion of the first connecting electrode 155n and the fourth opening 160b of the third insulating layer 160 may expose a portion of the second connecting electrode 155p.

The partial region of the third connecting electrode 155n exposed by the first opening 160a of the third insulating layer 160 may be referred to as the fourth contact region CT4, and the partial region of the second connecting electrode 155p exposed by the fourth opening 160b of the third insulating layer 160 may be referred to as the fifth contact region CT5.

The first and second electrode pads 165n and 165p may be formed on the substrate 105 having the third insulating layer 160. The first electrode pad 165n may be formed on the fourth contact region CT4 of the first connecting electrode 155n and the second electrode pad 165p may be formed on the fifth contact region CT5 of the second connecting electrode 155p. The first and second electrode pads 165n and 165p may be under bump metallurgy (UBM). In an example, the amount and arrangement of the first and second electrode pads 165n and 165p may be varied.

The first and second solder columns 170n and 170p may be formed on the substrate 105 having the first and second electrode pads 165n and 165p. The first solder column 170n may be formed on the first electrode pad 165n and the second solder column 170p may be formed on the second electrode pad 165p.

The molding portion 172 covering the side surfaces of the first and second solder columns 170n and 170p may be formed.

Figure 21:
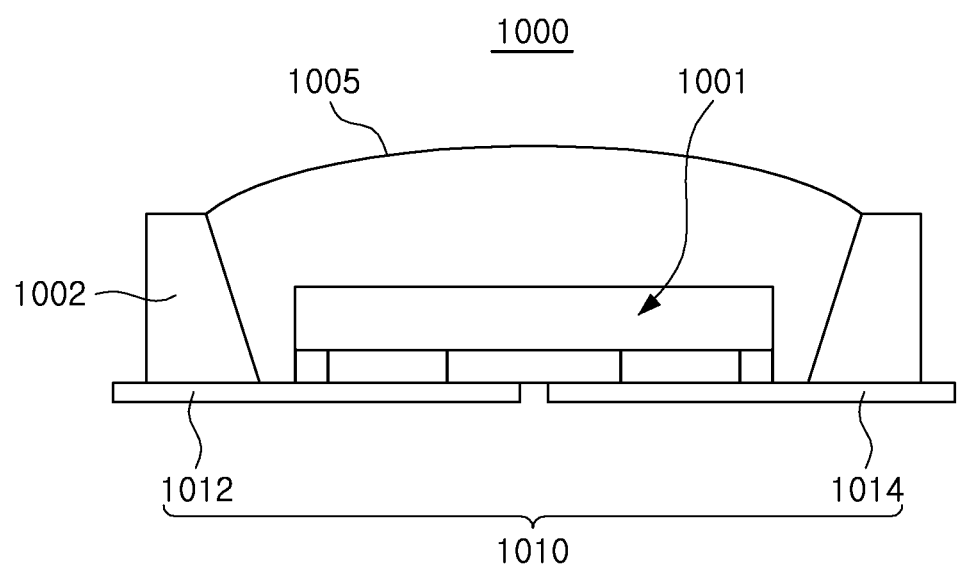
FIG. 21 is a cross-sectional view schematically illustrating an example in which a semiconductor light emitting device according to an example embodiment is applied to a package.

The semiconductor light emitting device 10 as described above may be commercialized as a package. Hereinafter, an example in which the semiconductor light emitting element 10 as described above is applied to a package will be described with reference to FIG. 21. FIG. 21 is a cross-sectional view schematically illustrating an example in which a semiconductor light emitting device according to an example embodiment is applied to a package.

Referring to FIG. 21, a semiconductor light emitting device package 1000 may include a semiconductor light emitting device 1001 as a light source, a package body 1002, a pair of lead frames 1010, and an encapsulant 1005. Here, the semiconductor light emitting device 1001 may be the semiconductor light emitting device 10 of FIGS. 1 and 2, and a description thereof will be omitted.

The semiconductor light emitting device 1001 may be mounted on the lead frame 1010 and electrically connected to the lead frame 1010.

The pair of lead frames 1010 may include a first lead frame 1012 and a second lead frame 1014. The semiconductor light emitting device 1001 may be connected to the first lead frame 1012 and the second lead frame 1014 by the first and second solder columns (170n and 170p of FIG. 2).

The package body 1002 may include a reflective cup to improve light reflection efficiency and light extraction efficiency. In the reflective cup, the encapsulant 1005 formed of a transparent material may be formed to encapsulate the semiconductor light emitting device 1001. The encapsulant 1005 may include a wavelength converting material such as a phosphor or a quantum dot.

According to the example embodiments of the technical idea, the semiconductor light emitting device having improved luminous flux and improved reliability may be provided.

While example embodiments have been shown and described above, it will be apparent to those skilled in the art that modifications and variations could be made without departing from the scope as defined by the appended claims.

What is claimed is:

1. A semiconductor light emitting device comprising:
   a light emitting structure comprising a plurality of semiconductor layers and configured to generate and emit light to an outside of the light emitting structure;
   a transparent electrode layer disposed on the light emitting structure;
   a transparent protective layer disposed on the transparent electrode layer;
   a distributed Bragg reflector (DBR) layer disposed on the transparent protective layer and covering at least a part of the transparent electrode layer; and
   at least one electrode pad connected to the transparent electrode layer through a hole or via,
   wherein the hole or via comprises a first inner wall and a second inner wall connected to each other and having different inclination angles with respect to an upper surface of the transparent electrode layer, and
   wherein the first inner wall is surrounded by the DBR layer, and the second inner wall is surrounded by the transparent protective layer.

2. The semiconductor light emitting device of claim 1, wherein the DBR layer comprises a plurality of films having different refractive indices.

3. The semiconductor light emitting device of claim 2, wherein the DBR layer comprises at least one selected from the group consisting of $SiO_2$, $SiN$, $SiO_xN_y$, $TiO_2$, $Si_3N_4$, $Al_2O_3$, $TiN$, $AlN$, $ZrO_2$, $TiAlN$, $TiSiN$, $HfO$, $NbO_2$, $TaO_2$, and $MgF_2$.

4. The semiconductor light emitting device of claim 3, wherein the transparent protective layer comprises at least one of $SiO_2$ and $MgF_2$.

5. The semiconductor light emitting device of claim 4, wherein the transparent protective layer has a thickness ranging from 10 to 200 nm.

6. The semiconductor light emitting device of claim 4, wherein the transparent protective layer comprises a material having a refractive index lower than a refractive index of a material forming at least a film, among the plurality of films forming the DBR layer, which is disposed the closest to the transparent protective layer.

7. The semiconductor light emitting device of claim 6, wherein the refractive index of the material forming the DBR layer is lower than a refractive index of a first conductive type semiconductor layer forming the light emitting structure and disposed below the transparent electrode layer.

8. The semiconductor light emitting device of claim 1, wherein the second inner wall extends to a surface of the transparent electrode layer which is exposed by removing or etching a portion of the transparent electrode layer, and thus, is lower than the upper surface of the transparent electrode layer on which the transparent protective layer is disposed.

9. The semiconductor light emitting device of claim 1, wherein the transparent electrode layer has a thickness ranging from 1 to 5 nm.

10. The semiconductor light emitting device of claim 1, wherein the transparent electrode layer is configured to inject a current received from the electrode pad to the light emitting structure to generate the light, and
wherein an interface exists between the transparent electrode layer and the transparent protective layer.

11. The semiconductor light emitting device of claim 1, wherein the transparent electrode layer comprises at least one selected from among indium tin oxide (ITO), zinc-doped indium tin oxide (ZITO), gallium indium oxide (GIO), zinc tin oxide (ZTO), fluorine-doped tin oxide (FTO), aluminum-doped zinc oxide (AZO), gallium-doped zinc oxide (GZO), $In_4Sn_3O_{12}$, and $Zn_{(1-x)}Mg_xO$ (zinc magnesium oxide (ZMO), where 0<x<1).

12. The semiconductor light emitting device of claim 1, further comprising a reflective electrode layer disposed on the DBR layer,
wherein the reflective electrode layer is configured to receive a current from the electrode pad, and comprises Ag, Cr, Ni, Ti, Al, Rh, Ru, Au, or a combination thereof.

13. The semiconductor light emitting device of claim 12, wherein the DBR layer form an omni-directional reflector (ODR) with the reflective electrode layer.

14. A semiconductor light emitting device comprising:
a light emitting structure comprising a plurality of semiconductor layers and configured to generate and emit light to an outside of the light emitting structure;
a transparent electrode layer disposed on the light emitting structure;
a transparent protective layer disposed on the transparent electrode layer;
an insulating layer disposed on the transparent protective layer and covering at least a part of the transparent electrode layer; and
at least one electrode pad connected to the transparent electrode layer through a hole or via,
wherein a refractive index of the transparent protective layer is lower than a refractive index of the insulating layer,
wherein the hole or via comprises a first inner wall and a second inner wall connected to each other and having different inclination angles with respect to an upper surface of the transparent electrode layer, and
wherein the first inner wall is surrounded by the insulating layer, and the second inner wall is surrounded by the transparent protective layer.

15. The semiconductor light emitting device of claim 14, wherein the second inner wall extends to a surface of the transparent electrode layer which is exposed by removing or etching a portion of the transparent electrode layer, and thus, is lower than the upper surface of the transparent electrode layer on which the transparent protective layer is disposed.

16. The semiconductor light emitting device of claim 14, wherein the insulating layer comprises $SiO_2$ and the transparent protective layer comprises $MgF_2$.

17. A semiconductor light emitting device comprising:
a light emitting structure configured to generate and emit light to an outside of the light emitting structure, and comprising a first conductive type semiconductor layer, a second conductive type semiconductor layer, and an active layer disposed therebetween in a recess region and a mesa region;
wherein, in the recess region, the first conductive type semiconductor layer is connected to a first electrode pad, and, in the mesa region, the second conductive type semiconductor layer is connected to a second electrode pad through at least one hole or via,
wherein, in the mesa region, a transparent electrode layer, a transparent protective layer, and a distributed Bragg reflector (DBR) layer are stacked in this order on the second conductive type semiconductor layer, and the second electrode pad is connected to the transparent electrode layer through a hole or via, and
wherein the transparent protective layer comprises a material having a refractive index lower than a refractive index of a material forming at least a film, among a plurality of films forming the DBR layer, which is disposed the closest to the transparent protective layer.

18. The semiconductor light emitting device of claim 17, wherein the DBR layer comprises the plurality of films having different refractive indices and comprises at least one selected from the group consisting of $SiO_2$, SiN, $SiO_xN_y$, $TiO_2$, $Si_3N_4$, $Al_2O_3$, TiN, AlN, $ZrO_2$, TiAlN, TiSiN, HfO, $NbO_2$, $TaO_2$, and $MgF_2$.

19. The semiconductor light emitting device of claim 17, wherein the DBR layer comprises the plurality of films having different refractive indices.

20. The semiconductor light emitting device of claim 17, wherein the hole or via comprises a first inner wall, and a second inner wall connected to each other and having different inclination angles with respect to an upper surface of the transparent electrode layer, and
wherein the first inner wall is surrounded by the DBR layer, and the second inner wall is surrounded by the transparent protective layer.

21. The semiconductor light emitting device of claim 17, wherein, in the mesa region, a reflective electrode layer is disposed on the DBR layer, and configured to receive a current from the second electrode pad.

* * * * *